(12) United States Patent
Hopkins

(10) Patent No.: US 9,293,342 B2
(45) Date of Patent: *Mar. 22, 2016

(54) PATTERNED BASES, AND PATTERNING METHODS

(71) Applicant: Micron Technology, Inc., Boise, ID (US)

(72) Inventor: John D. Hopkins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/548,004

(22) Filed: Nov. 19, 2014

(65) Prior Publication Data

US 2015/0076663 A1 Mar. 19, 2015

Related U.S. Application Data

(63) Continuation of application No. 13/631,068, filed on Sep. 28, 2012, now Pat. No. 8,921,034.

(51) Int. Cl.
| | |
|---|---|
| *G03F 7/00* | (2006.01) |
| *H01L 21/308* | (2006.01) |
| *H01L 27/108* | (2006.01) |
| *H01L 27/115* | (2006.01) |
| *H01L 21/033* | (2006.01) |
| *H01L 29/06* | (2006.01) |

(52) U.S. Cl.
CPC .......... *H01L 21/3086* (2013.01); *G03F 7/0035* (2013.01); *H01L 21/0337* (2013.01); *H01L 21/3088* (2013.01); *H01L 27/10894* (2013.01); *H01L 27/11526* (2013.01); *H01L 27/11529* (2013.01); *H01L 29/0657* (2013.01)

(58) Field of Classification Search
CPC ........................ G03F 7/0035; H01L 27/11526

USPC .......... 257/499, 773; 438/694; 430/310, 311, 430/313

See application file for complete search history.

(56) References Cited

U.S. PATENT DOCUMENTS

| | | | |
|---|---|---|---|
| 8,142,986 B2 * | 3/2012 | Sim ..................... | H01L 21/0337 430/313 |
| 8,227,349 B2 | 7/2012 | Kim et al. | |
| 8,785,327 B2 | 7/2014 | Kikutani | |
| 8,921,034 B2 * | 12/2014 | Hopkins ........... | H01L 27/10894 257/499 |
| 2011/0256723 A1 | 10/2011 | Lee et al. | |
| 2012/0282779 A1 | 11/2012 | Arnold et al. | |
| 2013/0256827 A1 * | 10/2013 | Fischer ............... | H01L 21/0338 257/499 |

OTHER PUBLICATIONS

U.S. Appl. No. 13/080,205, filed Apr. 5, 2011 by Inventor John D. Hopkins.

* cited by examiner

*Primary Examiner* — David Vu
*Assistant Examiner* — Brandon Fox
(74) *Attorney, Agent, or Firm* — Wells St. John P.S.

(57) ABSTRACT

Some embodiments include methods of patterning a base. First and second masking features are formed over the base. The first and second masking features include pedestals of carbon-containing material capped with silicon oxynitride. A mask is formed over the second masking features, and the silicon oxynitride caps are removed from the first masking features. Spacers are formed along sidewalls of the first masking features. The mask and the carbon-containing material of the first masking features are removed. Patterns of the spacers and second masking features are transferred into one or more materials of the base to pattern said one or more materials. Some embodiments include patterned bases.

15 Claims, 21 Drawing Sheets

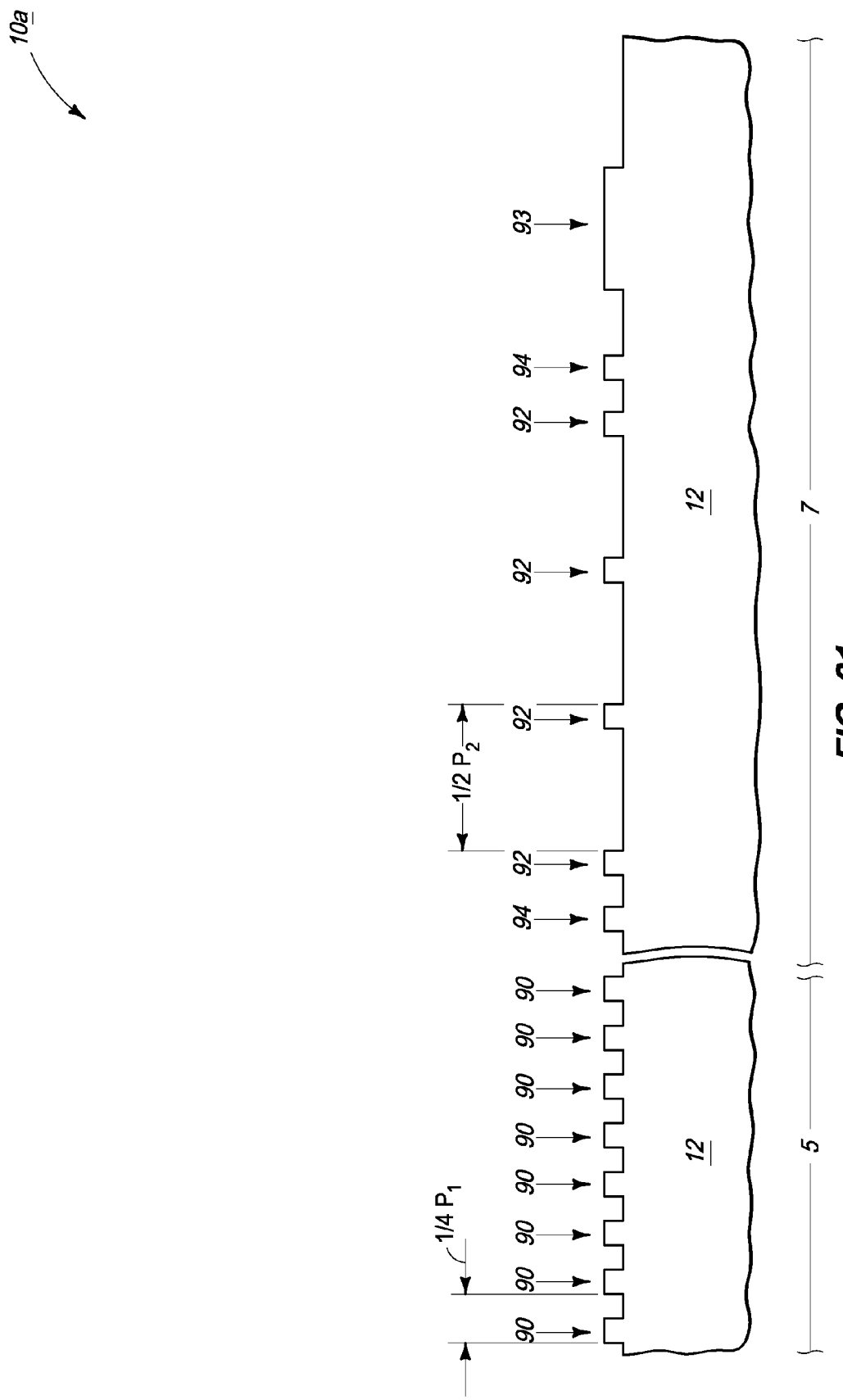

PATTERNED BASES, AND PATTERNING METHODS

RELATED PATENT DATA

This patent resulted from a continuation of U.S. patent application Ser. No. 13/631,068, which was filed Sep. 28, 2012, which issued as U.S. Pat. No. 8,921,034, and which is hereby incorporated herein by reference.

TECHNICAL FIELD

Patterned bases, and patterning methods.

BACKGROUND

Photolithography is commonly utilized during integrated circuit fabrication. Photolithography comprises patterning of photoresist by exposing the photoresist to a pattern of actinic energy, and subsequently developing the photoresist. The patterned photoresist may then be used as a mask, and a pattern may be transferred from the photolithographically-patterned photoresist to underlying materials.

A continuing goal in semiconductor processing is to reduce the size of individual electronic components, and to thereby enable smaller and denser integrated circuitry. A concept commonly referred to as "pitch" can be used to quantify the density of an integrated circuit pattern. A photolithographic technique will tend to be constrained by a minimum pitch below which the particular photolithographic technique cannot reliably form features. The minimum pitches associated with photolithographic techniques present obstacles to continued feature size reduction in integrated circuit fabrication.

Pitch multiplication, such as pitch doubling, is one proposed method for extending the capabilities of photolithographic techniques beyond their minimum pitch. The term "pitch-doubling" refers to a process whereby the number of features across a given area is doubled relative to the number of initial photoresist features, and thus a pitch-doubling process will ultimately form features on a pitch which is one-half of the pitch of the initial photoresist features.

In some applications, it is desired to form different levels of pitch multiplication across different regions of a semiconductor substrate. For instance, it may be desired to perform pitch-doubling along one region of a semiconductor substrate, and to perform pitch-quadrupling along another region of a semiconductor substrate. It can be advantageous to utilize common process steps when forming the different levels of pitch multiplication in that such may improve economy associated with a fabrication process. However, it can be difficult to develop appropriate processing to combine steps of the different levels of pitch multiplication without also introducing other complexities into the fabrication process which offset the gains achieved from the combined steps.

It is desirable to develop new methodologies for pitch multiplication, and to develop processes for applying such methodologies to integrated circuit fabrication. It is further desirable to develop methodologies for pitch multiplication which may efficiently enable multiple common steps to be performed while achieving different levels of pitch multiplication across different regions of a semiconductor substrate.

BRIEF DESCRIPTION OF THE DRAWINGS

FIGS. 16-21 are diagrammatic cross-sectional views of a semiconductor construction shown at various stages of another example embodiment method for patterning multiple regions of a base. The processing stage of FIG. 16 may follow that of FIG. 5 in some embodiments.

DETAILED DESCRIPTION OF THE ILLUSTRATED EMBODIMENTS

Some embodiments include methods which may be utilized to form multiple patterns over regions of a base, with some patterns having higher integration than others (i.e., being more tightly pitched than others). In some embodiments, the more highly integrated patterns may be suitable for fabricating high-density structures of a memory array (for instance, components of a dynamic random access memory (DRAM) array, components of a NAND array, etc.) and the other patterns may be suitable for fabricating circuitry peripheral to the memory array. The circuitry peripheral to the memory array may include, for example, control circuitry (such as, for example, logic circuitry) that controls access to memory cells of the memory array during read/write operations, and/or may include routing circuitry that electrically connects circuitry of the memory array to the control circuitry.

Example embodiments are described with reference to FIGS. 1-21.

Figure 1:
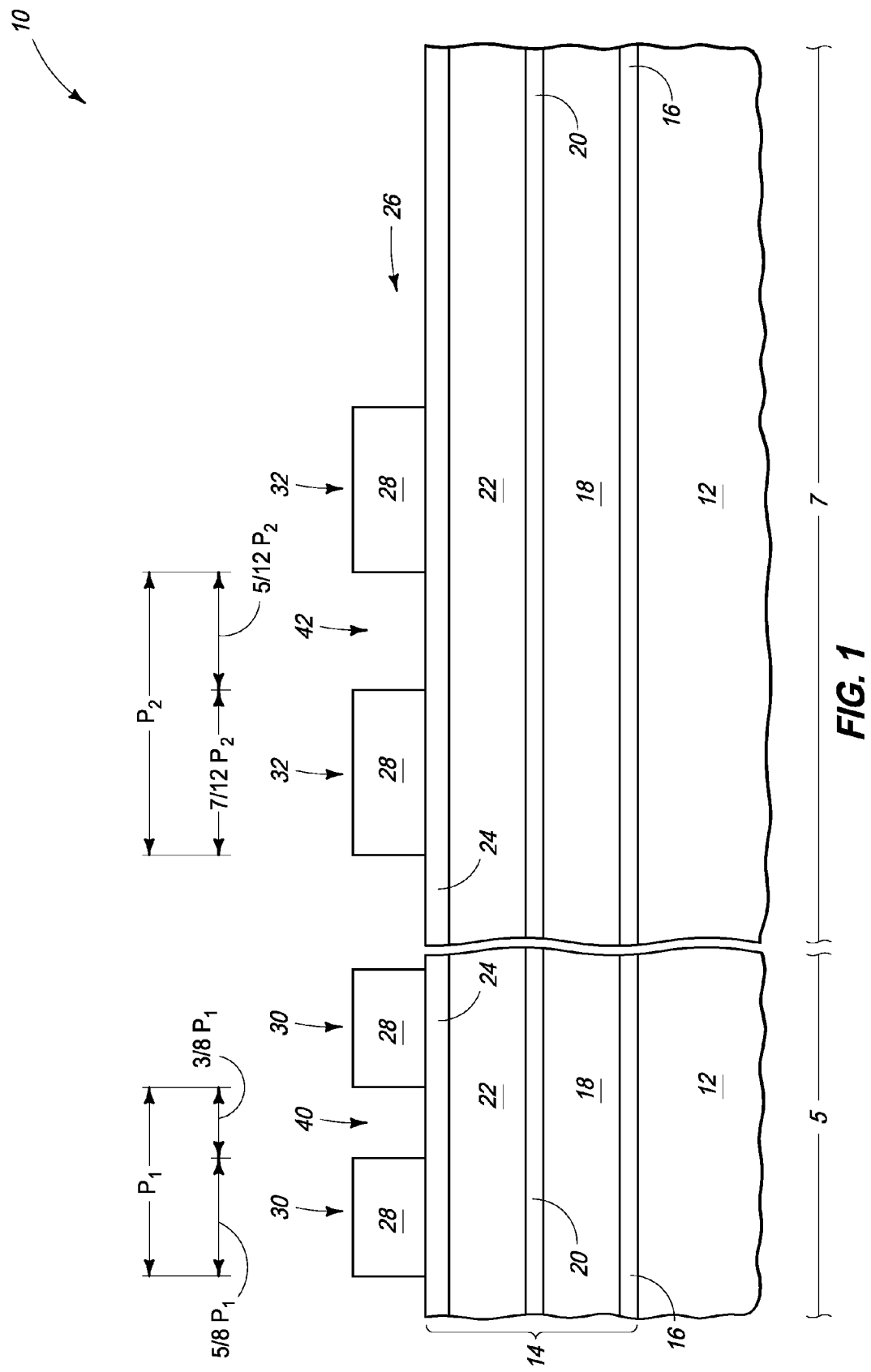
FIGS. 1-14 are diagrammatic cross-sectional views of a semiconductor construction shown at various stages of an example embodiment method for patterning multiple regions of a base.

Referring to FIG. 1, a semiconductor construction 10 is shown to comprise a base 12 subdivided into regions 5 and 7. Region 5 corresponds to a portion of the base where tightly packed circuitry of a highly integrated pattern is to be formed, and region 7 corresponds to a portion of the base where less tightly packed circuitry is to be formed. In some embodiments, region 5 may correspond to a portion of the base which will ultimately encompass a memory array (for instance, a DRAM array or a NAND array), and region 7 may correspond to a portion of the base which will ultimately encompass circuitry peripheral to the memory array (for instance, routing circuitry and/or control circuitry). Although only two regions are shown in FIG. 1, the methodology described herein may be utilized to form multiple patterns of different pitches across multiple regions of a base, and accordingly other embodiments (not shown) may have three or more regions of the base having three or more different densities of pitches that are to be formed.

The base 12 may comprise, consist essentially of, or consist of monocrystalline silicon, and may be referred to as a semiconductor substrate, or as a portion of a semiconductor substrate. The terms "semiconductor base," "semiconductor substrate," and "semiconductor construction" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

A stack 14 is over the base 12. The stack 14 includes a first material 16, a second material 18, a third material 20, a fourth material 22, and a fifth material 24. In some embodiments, the first material 16 may comprise, consist essentially of, or consist of silicon nitride; the second material 18 may comprise, consist essentially of, or consist of carbon; the third material 20 may comprise, consist essentially of, or consist of silicon oxynitride (e.g., a deposited anti-reflective coating); the fourth material 22 may comprise, consist essentially of, or consist of carbon; and the fifth material 24 may comprise, consist essentially of, or consist of silicon oxynitride (e.g., a deposited anti-reflective coating). In some embodiments, materials 20 and 24 may be referred to as a first silicon oxynitride material and a second silicon oxynitride material, respectively.

Although materials 20 and 24 may both comprise silicon oxynitride, the ratios of silicon, oxygen and nitrogen may vary in material 24 relative to material 20. For instance, material 20 may have a greater silicon content than material 24. In such embodiments, material 24 may be readily removed with an etch utilizing dilute hydrofluoric acid (for instance, hydrofluoric acid diluted about 100 fold with water), while material 20 may be more resistant to such etch than material 24. In some embodiments, material 20 may be heterogeneous, and may, for example, correspond to a so-called bilayer deposited anti-reflective coating; with material 20 comprising an upper portion which is compositionally different than a lower portion. For instance, the upper portion may be more enriched in silicon than the lower portion.

A patterned mask 26 is formed across the first and second regions 5 and 7 of the base 12. The patterned mask comprises a masking material 28. Such masking material may be photolithographically-patterned photoresist in some embodiments.

The patterned mask comprises first masking features 30 over the first region 5 of the base, and comprises second masking features 32 over the second region 7 of the base. In embodiments in which the masking material comprises photoresist, the features 30 and 32 may referred to as first and second photoresist features, respectively. The first masking features are formed to a first pitch, $P_1$; and the second masking features are formed to a second pitch, $P_2$. The first pitch is shown to be tighter than the second pitch; and in the shown embodiment $P_1$ is about ⅔ of $P_2$. The illustrated first masking features 30 are representative of a large number of masking features that may be formed across the region 5 of the base at the first pitch, $P_1$; and similarly the illustrated second masking features 32 are representative of a large number of masking features that may be formed across the region 7 of the base at the second pitch, $P_2$. In some embodiments, the features 30 and 32 may be formed in a common photolithography step.

The first masking features are spaced from one another by a gap 40, and the second masking features are separated from one another by a gap 42. In the shown embodiment, the first masking features have widths of about ⅝ $P_1$, and the second features 32 have widths of about 7/12 $P_2$. The gap 40 has a width of about ⅜ $P_1$, and the gap 42 has a width of about 5/12 $P_2$.

In the example embodiment processing which follows, the first masking features 30 are utilized to form a pitch-quadrupled pattern, while the features 32 are utilized to form a pitch-doubled pattern. Thus, features 30 are utilized to form relatively a highly integrated pattern, while features 32 are utilized to pattern a more loosely-spaced pattern. The shown embodiment enhances the density difference between the pattern formed from features 30 relative to that formed from features 32 by starting with a tighter pitch between features 30 than between 32. In other embodiments the features 30 and 32 may be formed to a same pitch as one another.

Figure 2:
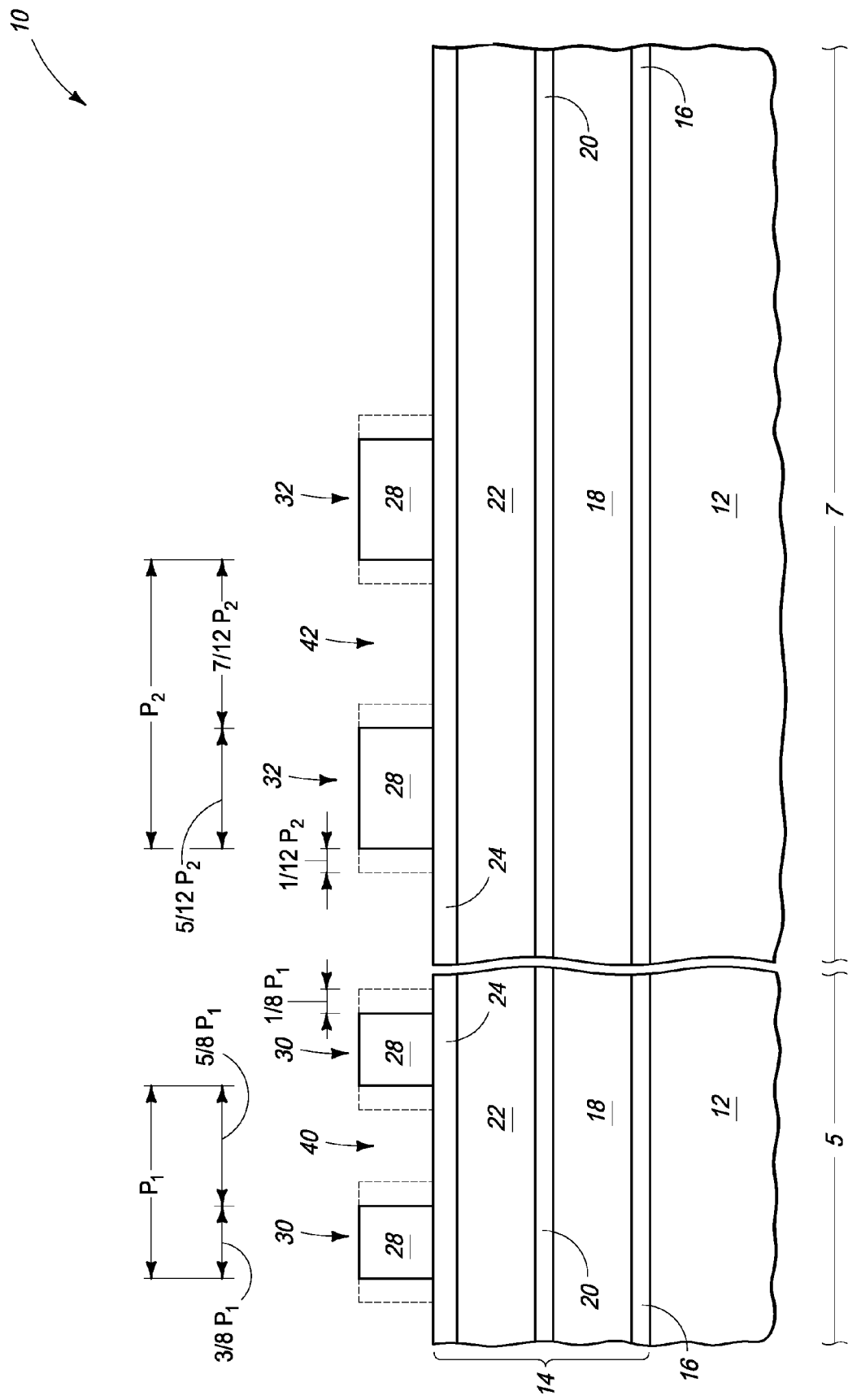

Referring to FIG. 2, the first and second masking features 30 and 32 are subjected to lateral trimming to remove material from the sides of features 30 and 32. In the shown embodiment, about ⅛ $P_1$ of material 28 is removed from each side of the features 30, and about 1/12 $P_2$ of material 28 is removed from each side of features 32 (with 1/12 $P_2$ being equivalent to ⅛ $P_1$ in the shown embodiment). The original locations of the sides of the features 30 and 32 (i.e., the locations of the sides of such features at the processing stage of FIG. 1) are shown in FIG. 2 in dashed-line view to assist the reader in understanding the dimensional changes that occurred to the features 30 and 32 through the lateral trimming. Although the tops of the features 30 and 32 are shown to be unaffected by the lateral trimming, in some embodiments the lateral trimming conditions may decrease the height of the features and/or may induce other changes to the features (e.g., may impose a dome-shape to the features). For instance, lateral trimming conditions may be chosen which isotropically etch the features 30 and 32.

The lateral trimming of features 30 and 32 may be omitted in some embodiments. If the lateral trimming is utilized, such lateral trimming may be accomplished with any suitable processing; including, for example, plasma etching within an inductively coupled reactor.

The lateral trimming reduces the widths of features 30 from the dimension of about ⅝ $P_1$ of FIG. 1 to a dimension of about ⅜ $P_1$; and causes a corresponding increase in the width of gap 40 from the dimension of about ⅜ $P_1$ of FIG. 1 to a dimension of about ⅝ $P_1$. Similarly, the lateral trimming reduces the widths of features 32 from the dimension of about 7/12 $P_2$ of FIG. 1 to a dimension of about 5/12 $P_2$; and causes a corresponding increase in the width of gap 42 from the dimension of about 5/12 $P_2$ of FIG. 1 to a dimension of about 7/12 $P_2$.

Figure 3:
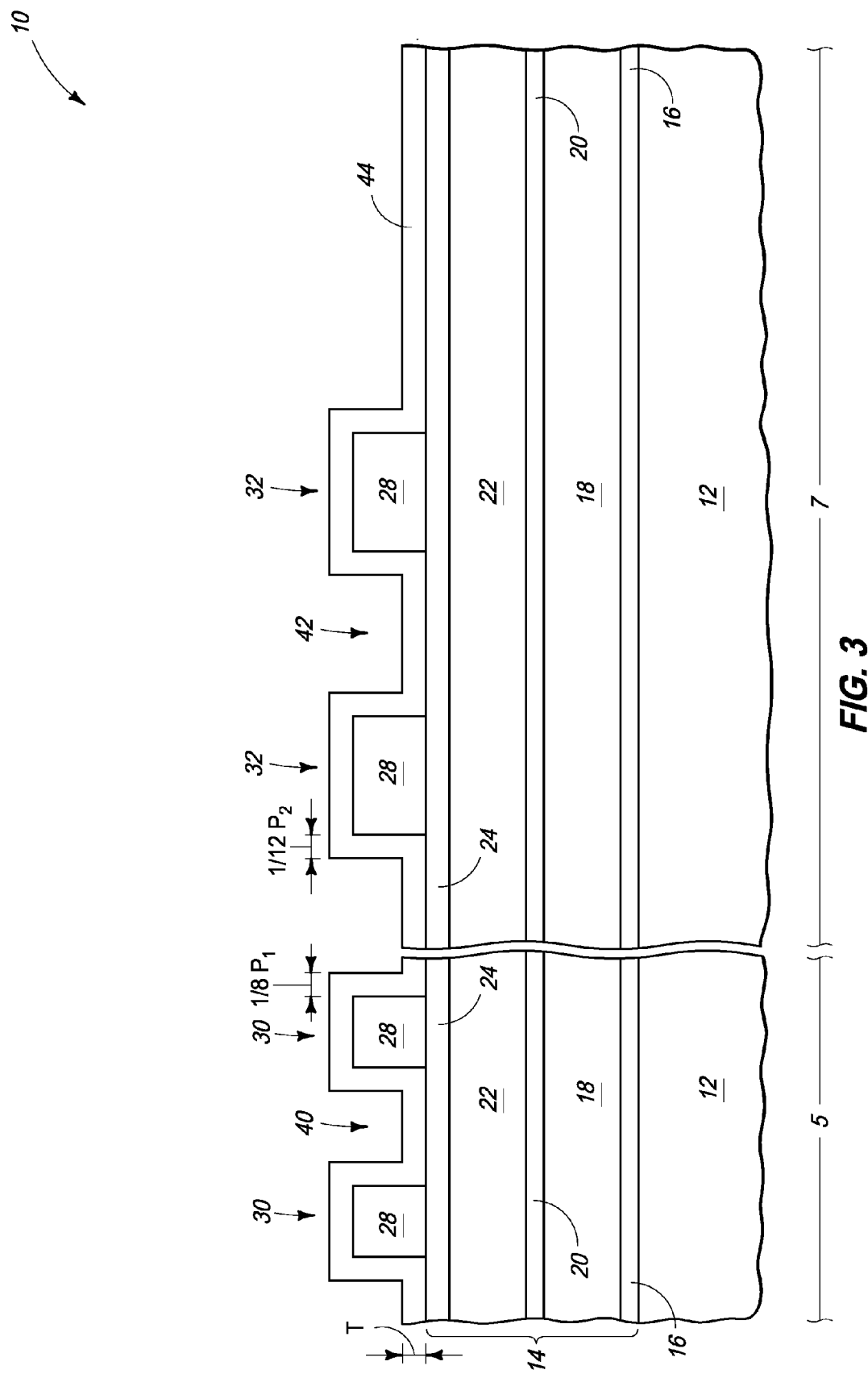

Referring to FIG. 3, spacer material 44 is formed over and between the masking features 30 and 32. The spacer material has a thickness, T, of about ⅛ $P_1$ (i.e., 1/12 $P_2$). The spacer material may comprise any suitable composition or combination of compositions, and in some embodiments may comprise, consist essentially of, or consist of silicon dioxide. The spacer material may be formed with any suitable methodology, including, for example, one or both of atomic layer deposition (ALD) and chemical vapor deposition (CVD). In the shown embodiment, the spacer material is formed conformally over and between the features 30 and 32 so that such spacer material maintains a substantially common thickness along horizontal and vertical surfaces.

Figure 4:
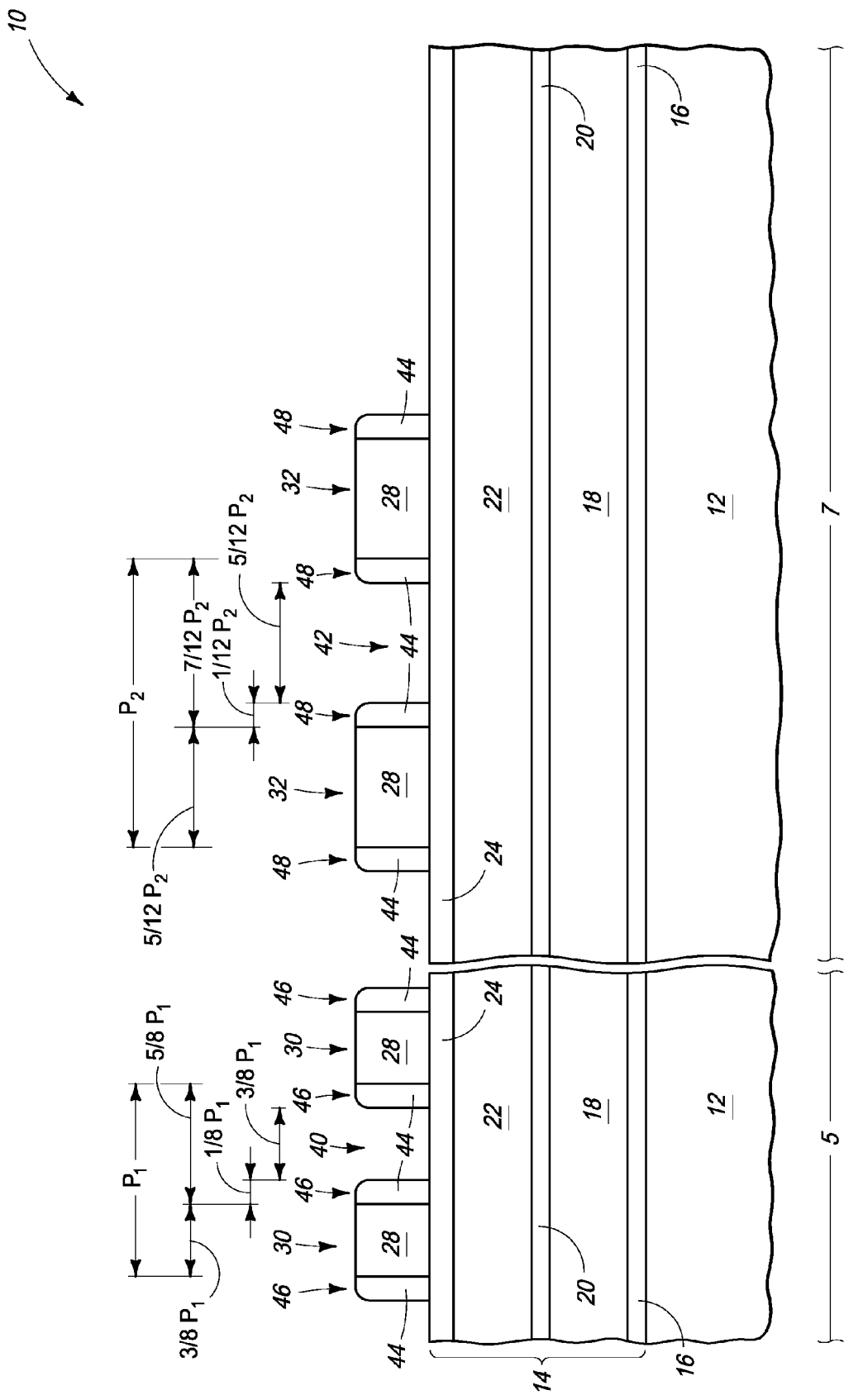

Referring to FIG. 4, spacer material 44 is subjected to an anisotropic etch to form first spacers 46 along the sidewalls of the masking features 30, and to form second spacers 48 along the sidewalls of the features 32. The spacers 46 and 48 have the same widths as one another, with the spacers 46 being shown to have widths of ⅛ $P_1$, and with the spacers 48 being shown to have widths of 1/12 $P_2$.

Figure 5:
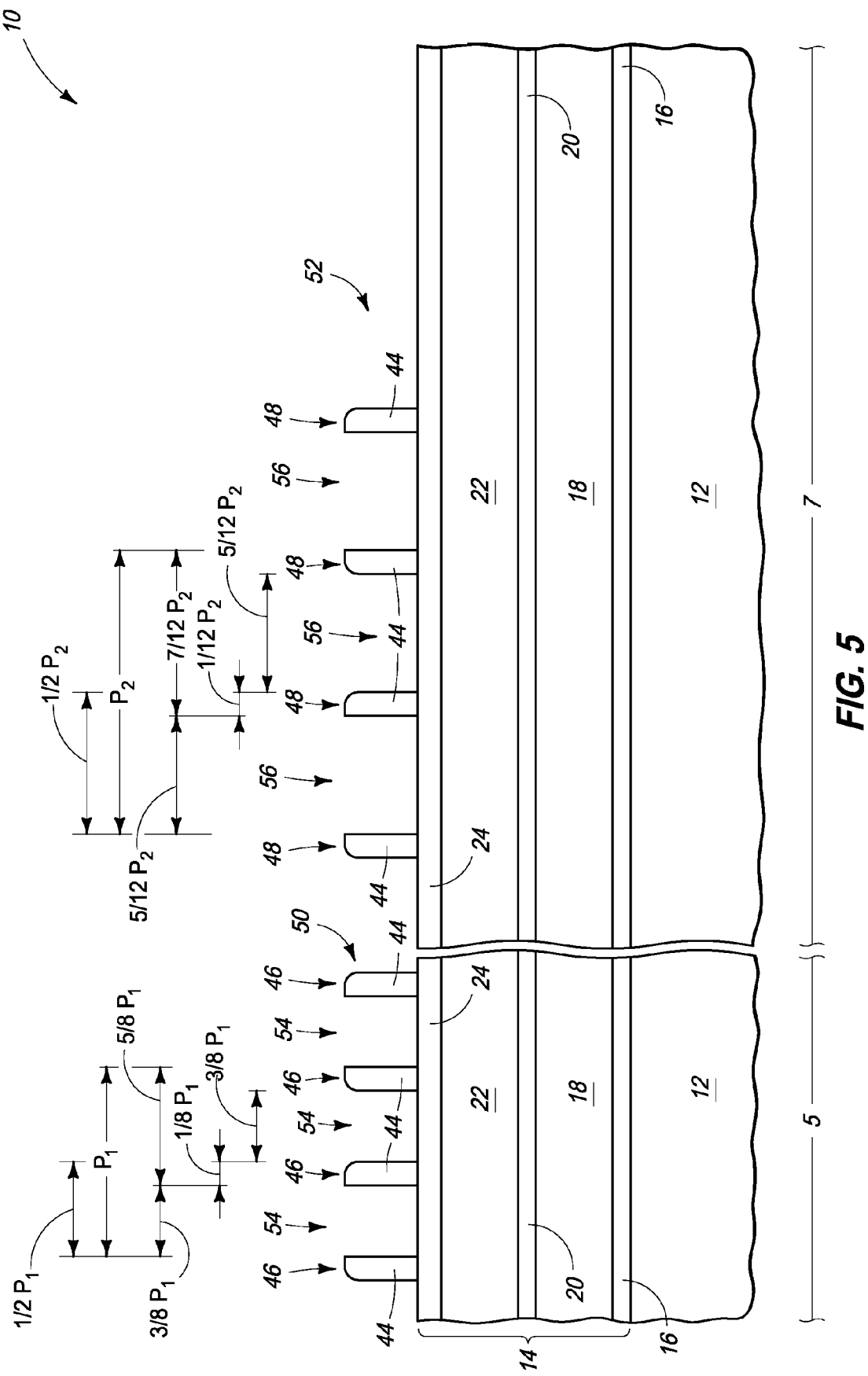

Referring to FIG. 5, masking features 30 and 32 (FIG. 4) are removed to leave a pattern 50 over region 5, and a pattern 52 over region 7. The pattern 50 comprises the first spacers 46 spaced-apart from one another by intervening gaps 54, and the pattern 52 comprises the second spacers 48 spaced-apart from one another by intervening gaps 56. The gaps 54 have widths of about ⅜ $P_1$, and the gaps 56 have widths of about 5/12 $P_2$. Accordingly, spacers 46 are on a pitch of about ½ $P_1$, and spacers 48 are on a pitch of about ½ $P_2$.

In some embodiments, the patterns 50 and 52 may be considered to have been formed utilizing the first and second masking features 30 and 32 (FIG. 4) as templates.

Figure 6:
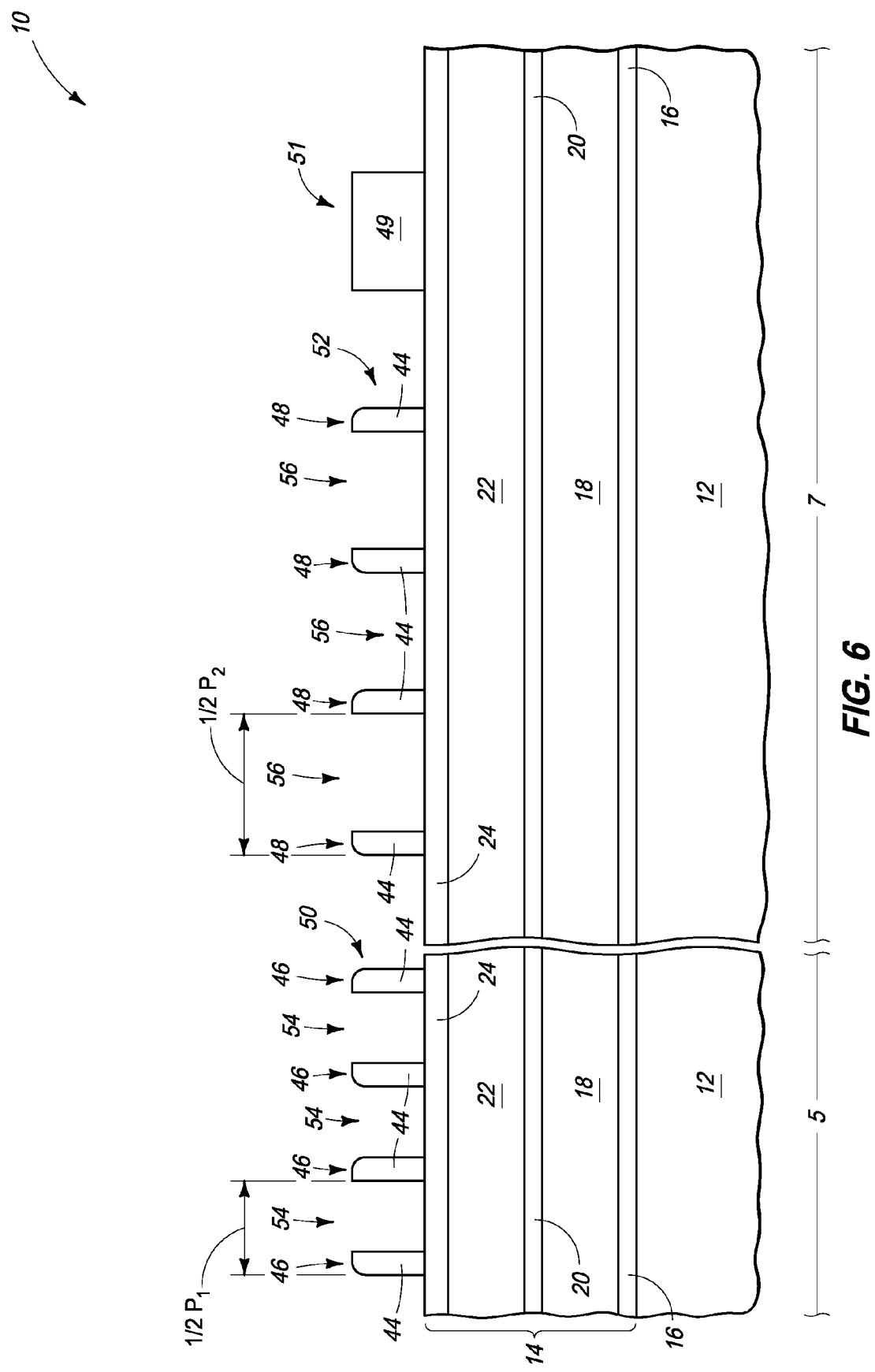

Referring to FIG. 6, a patterned masking feature 51 is formed over region 7 of base 12. The masking feature comprises a material 49 which may be the same as the material 28 of masking features 30 and 32 (FIG. 1). In some embodiments, materials 28 and 49 may comprise photoresist, and feature 51 be referred to as an additional photoresist feature to distinguish it from the features 30 and 32 of FIG. 1. Although one additional masking feature 50 is shown, such feature may be representative of a large number of additional features which are formed at the processing stage of FIG. 6.

The feature 51 is a lithographic-sized feature, whereas masking features 46 and 48 of FIG. 6 are sub-lithographic features. Accordingly, feature 51 is shown to have a much larger width along the cross-section of FIG. 6 than the features 46 and 48. In some embodiments, the ratio of the width of feature 51 relative to the widths of either of the features 46 and 48 along the cross-section of FIG. 6 may be at least about 2, at least about 3, at least about 4, etc.

Figure 7:
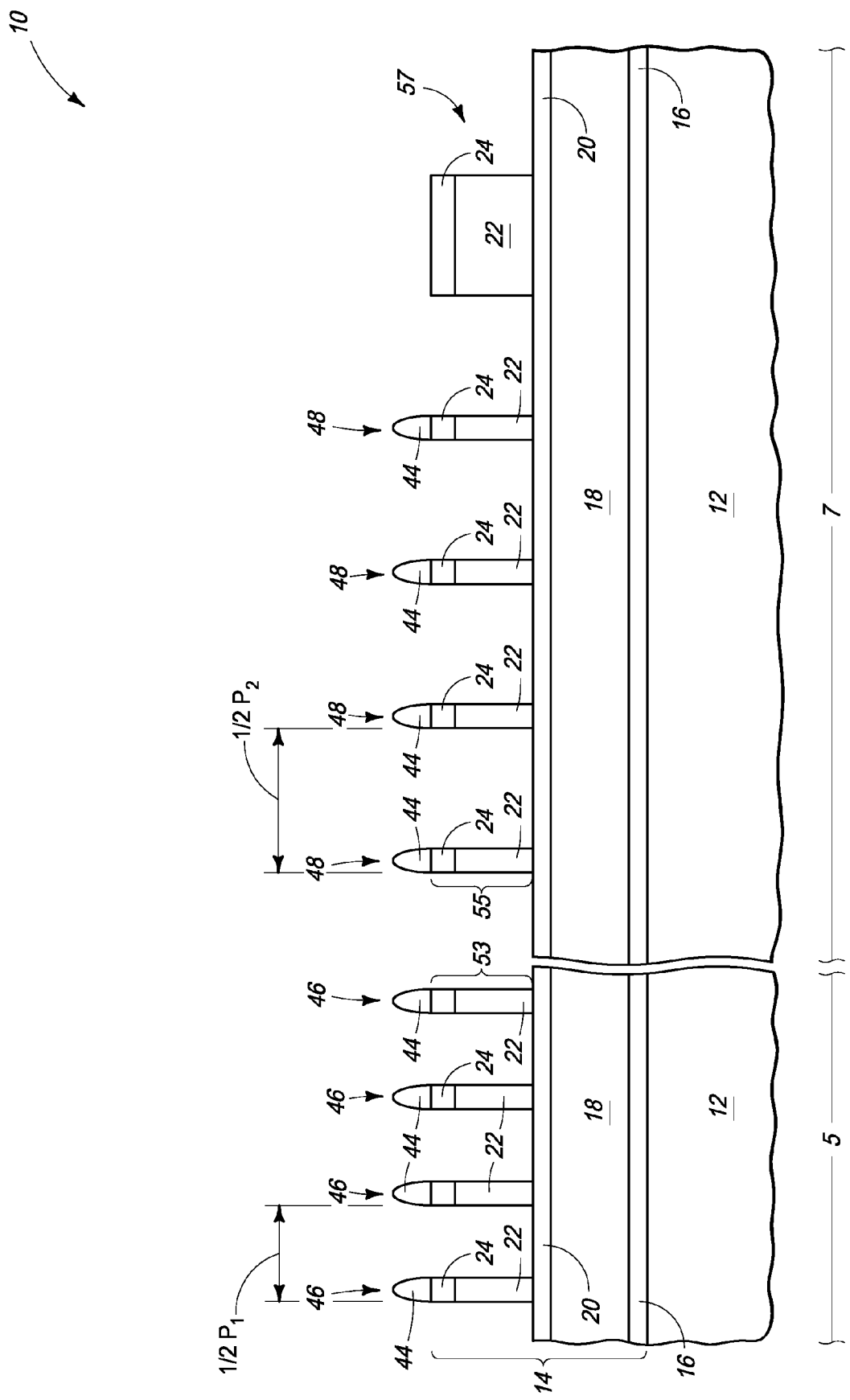

Referring to FIG. 7, the silicon oxygen nitride material 24 and carbon-containing material 22 are etched while using the first spacers 46, second spacers 48, and masking feature 51 (FIG. 6) as a mask. Such forms first pedestals 53 under the spacers 46, second pedestals 55 under the spacers 48, and a third pedestal 57 under the masking feature 51 (FIG. 6). The pedestals 53 and 55 comprise capping silicon oxynitride 24 over carbon-containing material 22. In the shown embodiment, some residuals of spacers 46 and 48 remain after etching through materials 22 and 24, but in other embodiments the entirety of the spacers 46 and 48 may be removed during the etch through materials 22 and 24. Also, in the shown embodiment an entirety of masking feature 51 (FIG. 6) is removed during the etching through materials 22 and 24, but in other embodiments some of the masking feature 51 may remain after etching through materials 22 and 24.

In the shown embodiment, the first pedestals 53 are aligned on a pitch which is about ½ $P_1$, and the second pedestals 57 are aligned on a pitch which is about ½ $P_2$. In some embodiments, the pedestals 53 and 55 may be referred to as first and second masking features, respectively; with such masking features comprising pedestals of carbon-containing material 22 capped with silicon oxynitride 24. Also, pedestal 57 may be referred to as a third masking feature, which also comprises carbon-containing material 22 capped with silicon oxynitride 24.

Figure 8:
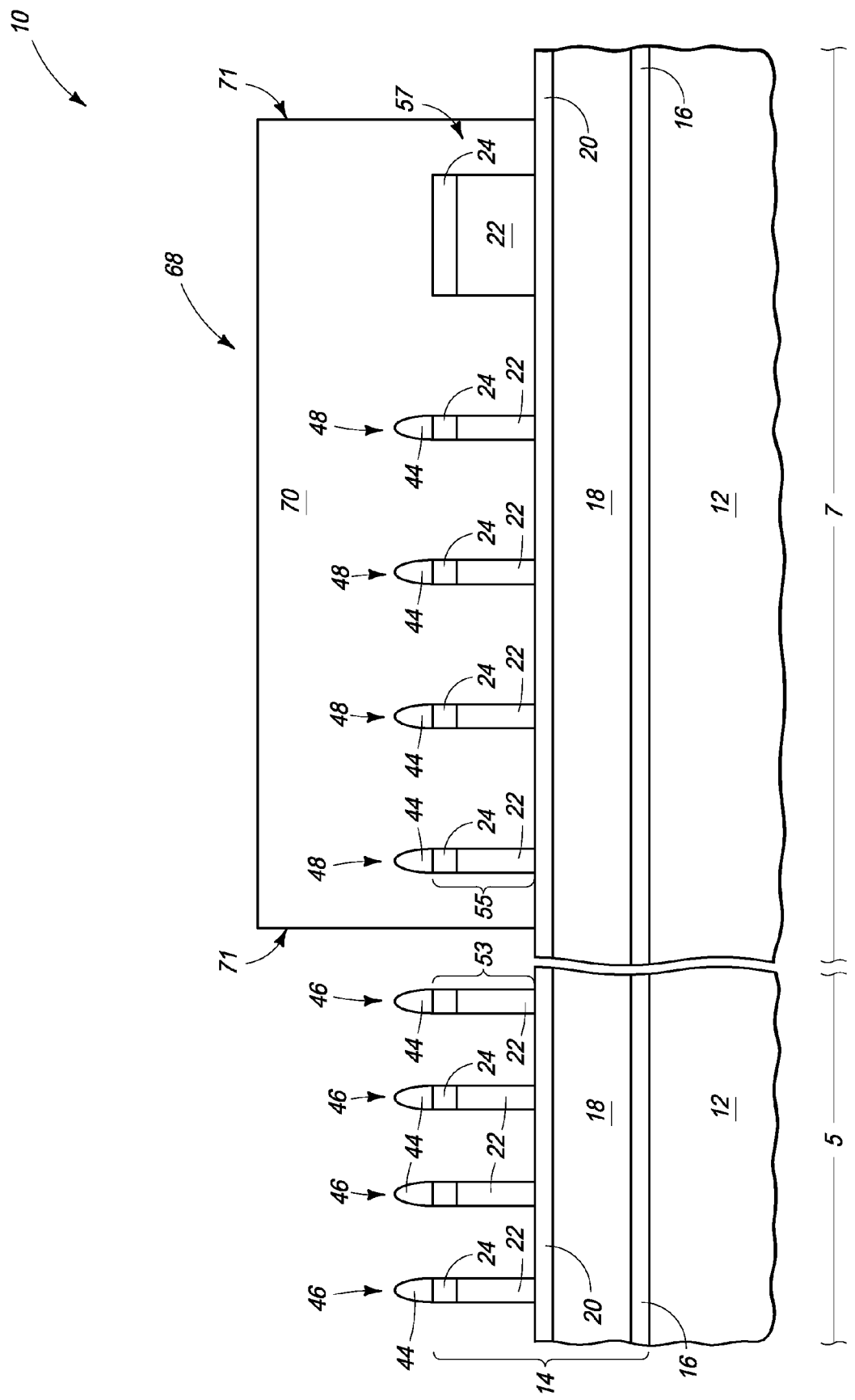

Referring to FIG. 8, a protective mask 68 is formed over the pedestals 55 and 57, while leaving the pedestals 53 exposed. The protective mask 68 comprises a patterned masking material 70. In some embodiments, such patterned masking material may correspond to photolithographically-patterned photoresist. In some embodiments, mask 68 may be referred to as a second mask; and the feature 51 together with the spacers 46 and 48 at the processing stage of FIG. 7 may be referred to as a first mask.

The protective mask 68 has lateral edges 71. Although the mask appears to have two lateral edges in the side view of FIG. 8, the mask may have a continuous lateral periphery when viewed from above the construction; and thus the lateral edges 71 may be part of a continuous lateral periphery of the protective mask.

Figure 9:
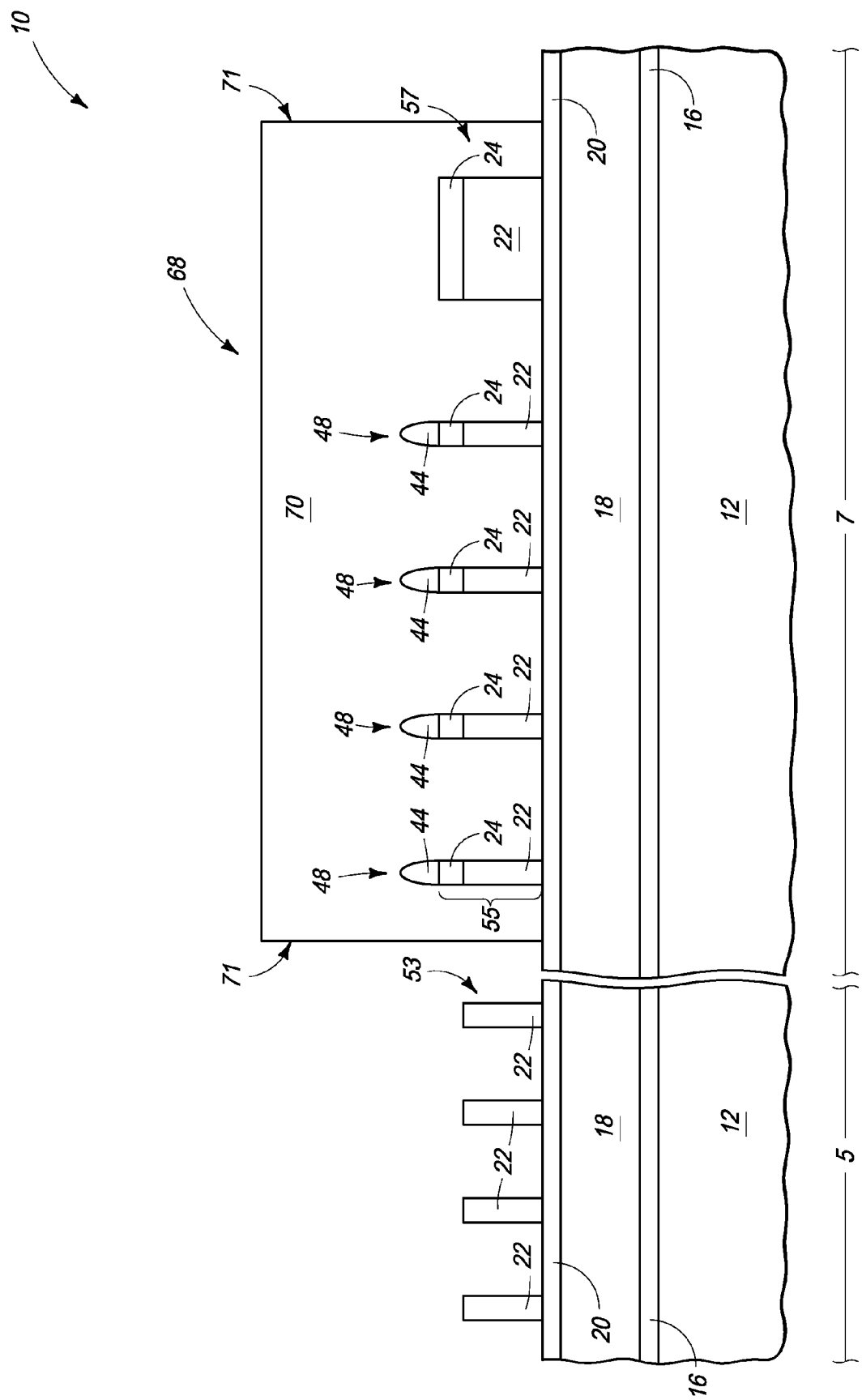

Referring to FIG. 9, residual material of spacers 46 (FIG. 8) is removed from over exposed pedestals 53, and silicon oxynitride 24 is also removed from such pedestals. The spacer material 46 and silicon oxynitride 24 may be removed with any suitable etches, with the shown etching being selective for materials 24 and 44 relative to materials 20 and 22.

Figure 10:
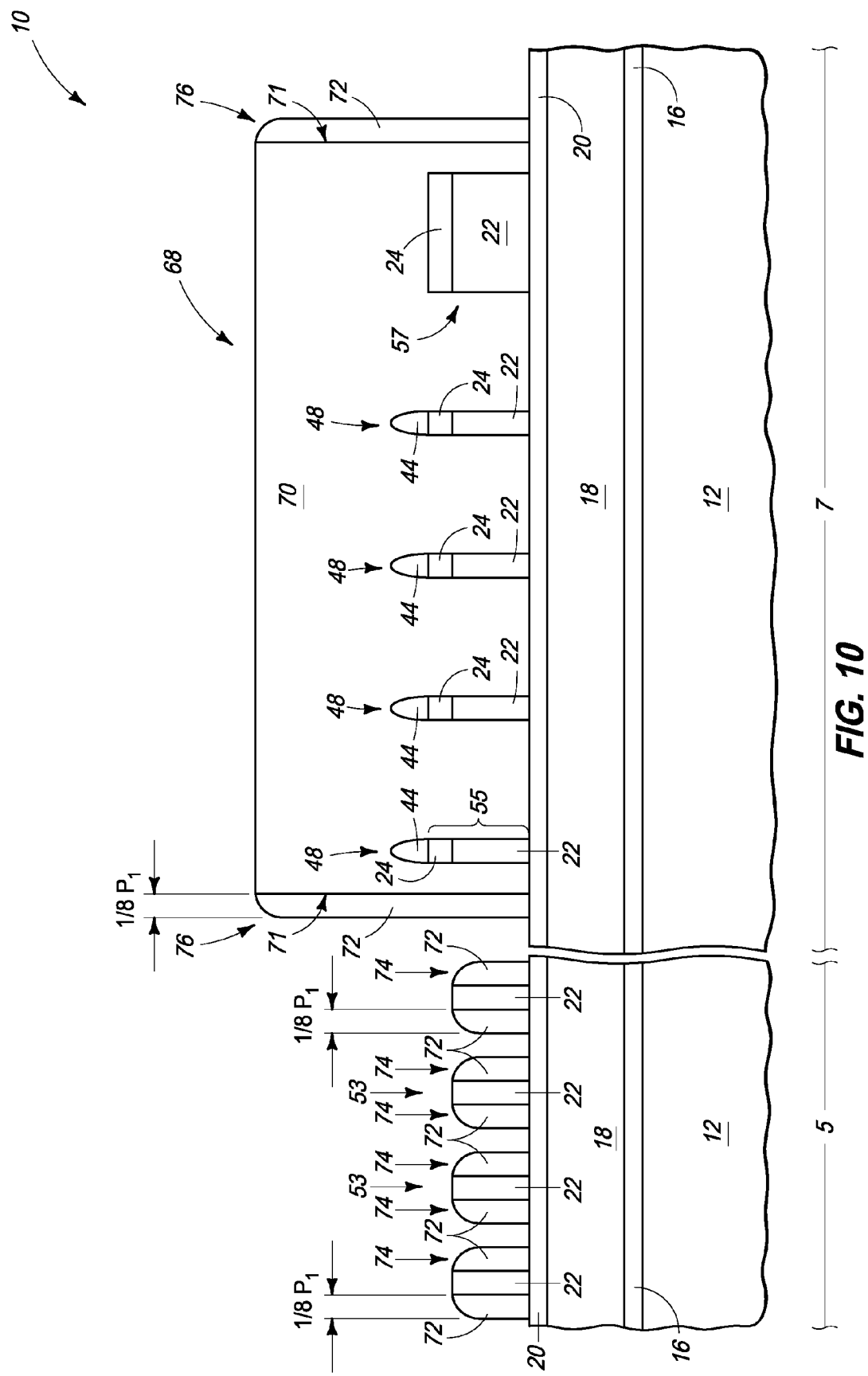

Referring to FIG. 10, anisotropically-etched spacers 74 are formed along sidewalls of pedestals 53, and anisotropically-etched spacers 76 are formed along the lateral edges 71 of mask 68. In some embodiments, spacers 74 may be referred to as third spacers to distinguish them from the first and second spacers 46 and 48 shown in FIG. 6, and spacers 76 may be referred to as fourth spacers. In some embodiments, the spacers 74 and/or 76 may be referred to as "additional spacers" to distinguish them from the first and second spacers 46 and 48 of FIG. 6.

The spacers 74 and 76 comprise spacer material 72, and may be formed with processing analogous to that described above with reference to FIGS. 3 and 4. The spacer material 72 may comprise any suitable composition or combination of compositions, and in some embodiments may comprise, consist essentially of, or consist of silicon oxide.

In the shown embodiment, the spacers 74 and 76 have widths of about ⅛ $P_1$ (which is equivalent to 1/12 $P_2$ in the embodiment presented herein, as described in FIG. 2).

Although there appear to be two spacers 76 in the side view of FIG. 10, the illustrated spacers 76 may be part of single continuous spacer that extends along a continuous lateral periphery of the protective mask 68.

The configuration of FIG. 10 shows four pedestals 55 between the opposing spacers 76. Such is for diagrammatic purposes only, and there may be more or less than the illustrated number of pedestals between the opposing spacers. In some embodiments, there may be many more than four pedestals 55 between such opposing spacers. Similarly, there may be more than the single illustrated pedestal 57 in some embodiments.

Although the illustrated embodiment has spacers 74 formed after removing silicon oxynitride material 24 (FIG. 8) from pedestals 53, in other embodiments (not shown) such silicon oxynitride material may be removed after forming the spacers instead of before forming the spacers.

Figure 11:
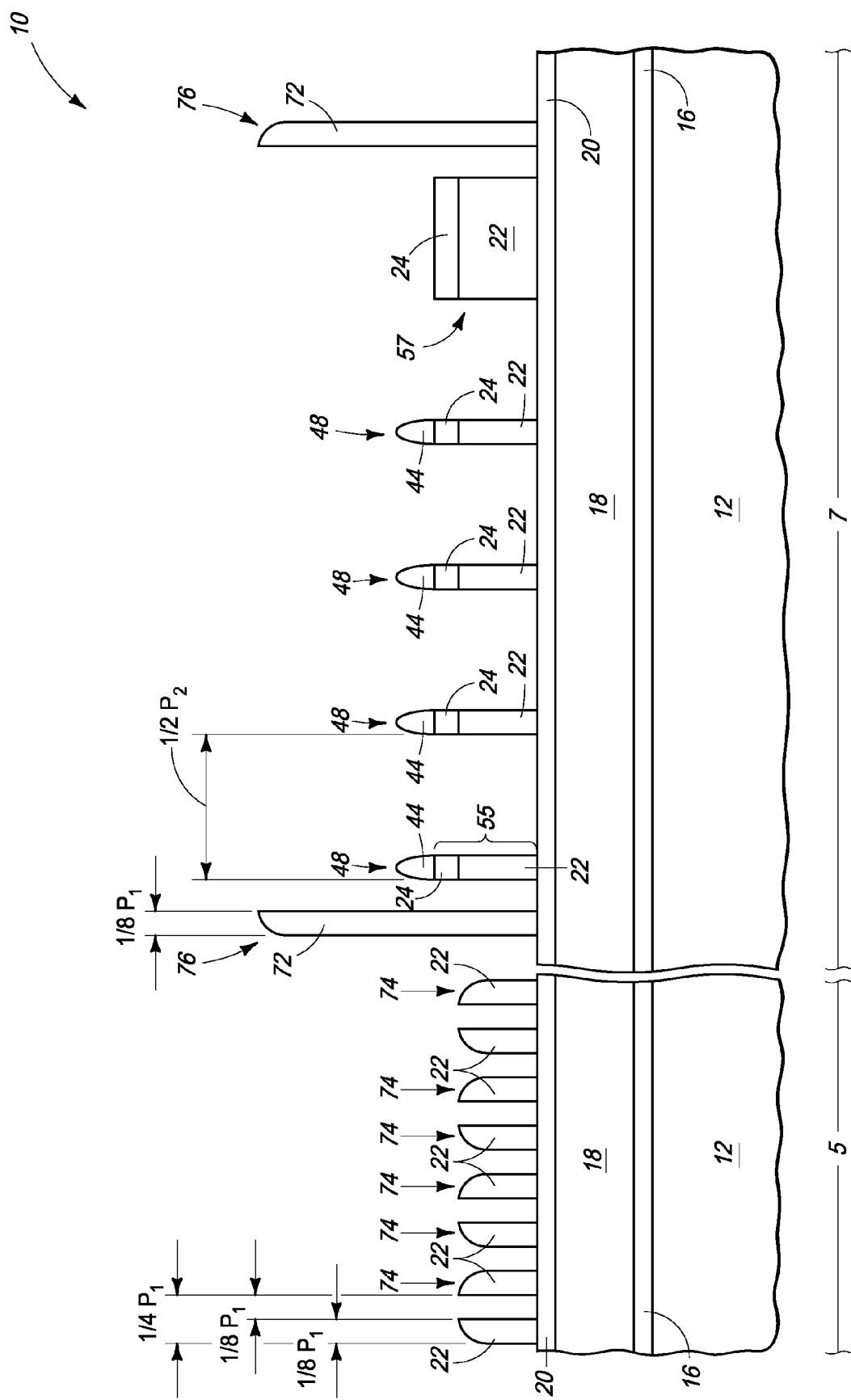

Referring to FIG. 11, the photoresist mask 68 (FIG. 10) is removed together with the carbon-containing material 22 of pedestals 53 (FIG. 10) utilizing an anisotropic oxidative etch. The anisotropic etch removes organic material of pedestals 53 and mask 68, while leaving spacers 74, spacers 76, pedestals 55 and pedestal 57 remaining over base 12. The anisotropic oxidative etch may comprise any suitable processing, such as, for example, utilization of an $O_2$ plasma together with a substrate temperature of at least about 100° C., and a biased chuck. In some embodiments, the etch may utilize $O_2/SO_2$; with $O_2$ being a reactive component and $SO_2$ being a passivating component that provides a polymer (passivating layer) on sidewalls to alleviate or prevent lateral etching. The anisotropic oxidative etch may be selective relative to silicon dioxide 44, silicon oxynitride 24 and silicon oxynitride 20, in some embodiments.

The spacers 74 remaining at the processing stage of FIG. 11 are on a pitch of about ¼ $P_1$ in the shown embodiment, and the pedestals 55 are on a pitch of about ½ $P_2$.

In some embodiments, the spacers 76 of FIG. 11 may be comprised by a wall that extends around a portion of the second region 7 of base 12, with such portion including a region between the illustrated spacers 76. In the shown embodiment, the pedestal 57 patterned from the additional photoresist feature 51 (FIG. 6) is within such portion.

Figure 12:
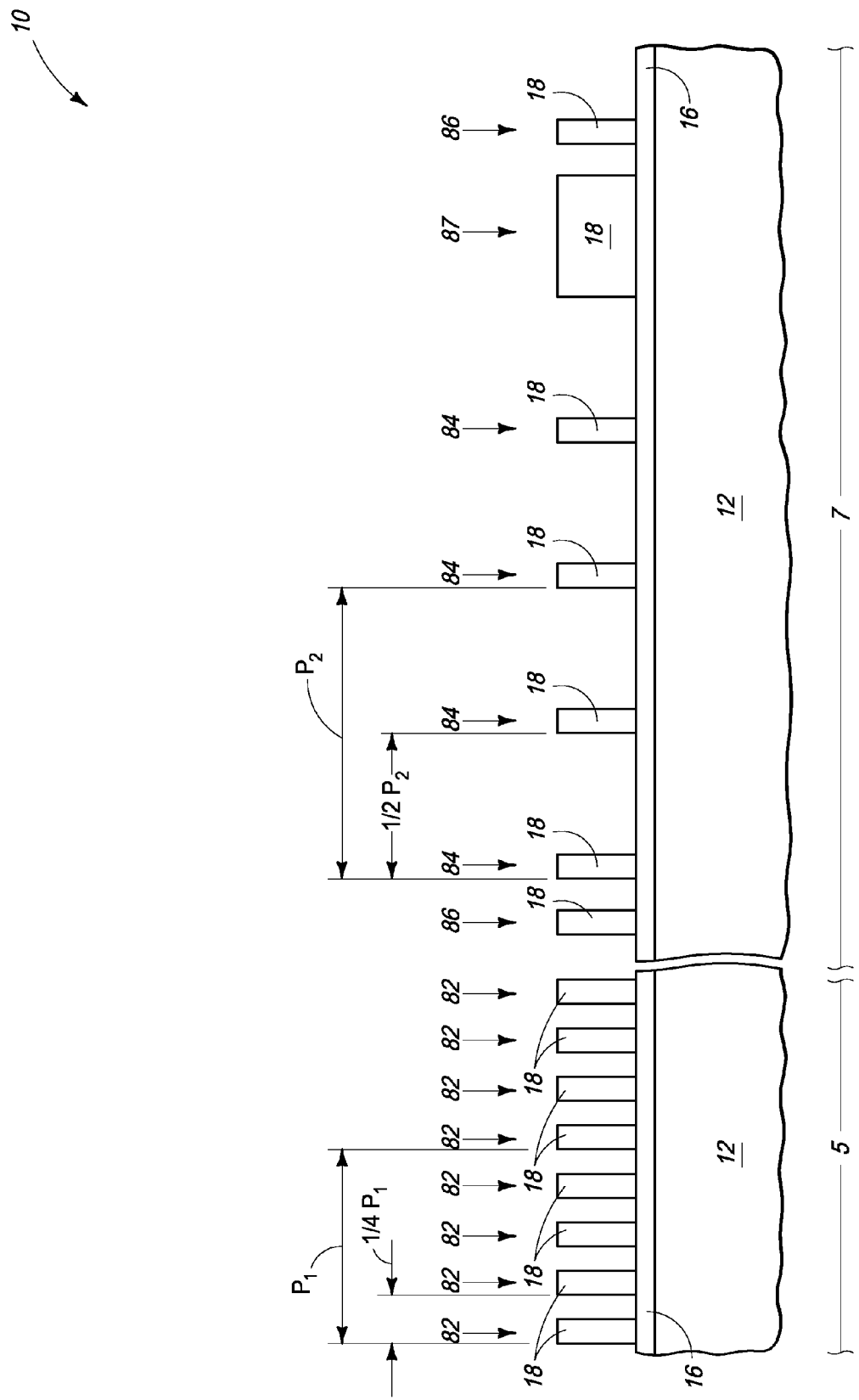

Referring to FIG. 12, the pattern of spacers 74 (FIG. 11) is transferred into the underlying material 18 to form a plurality of masking features 82 over region 5 of the base; and the pattern of pedestals 55 (FIG. 11) is transferred into the underlying material 18 to form a plurality of masking features 84 over region 7 of the base. Also, the pattern of spacers 76 (FIG. 11) is transferred into the underlying material 18 to form masking features 86, and the pattern of pedestal 57 (FIG. 11) is transferred into underlying material 18 to form a masking feature 87. Although there appear to be two masking features 86 in the side view of FIG. 10, the illustrated masking features 86 may be part of single continuous masking feature that forms a fence around a portion of region 7.

The features 82, 84, 86 and 87 may be formed with any suitable processing. For instance, in some embodiments material 20 (FIG. 11) comprises silicon oxynitride, and an etch may be utilized to pattern the silicon oxynitride into a hard mask (the etch may utilize, for example, $CF_4$/HBr; with $CF_4$ being a reactive component and HBr being a passivating component). The patterned hard mask may be utilized during subsequent etching of material 18 to pattern material 18 into the features 82, 84, 86 and 87. In some embodiments, material 18 may comprise carbon and material 16 may comprise silicon nitride, and the etch utilized to pattern material 18 may be selective for carbon relative to silicon nitride.

The masking features 82 are on a pitch of about ¼ $P_1$, and the masking features 84 are on a pitch of about ½ $P_2$.

Figure 13:
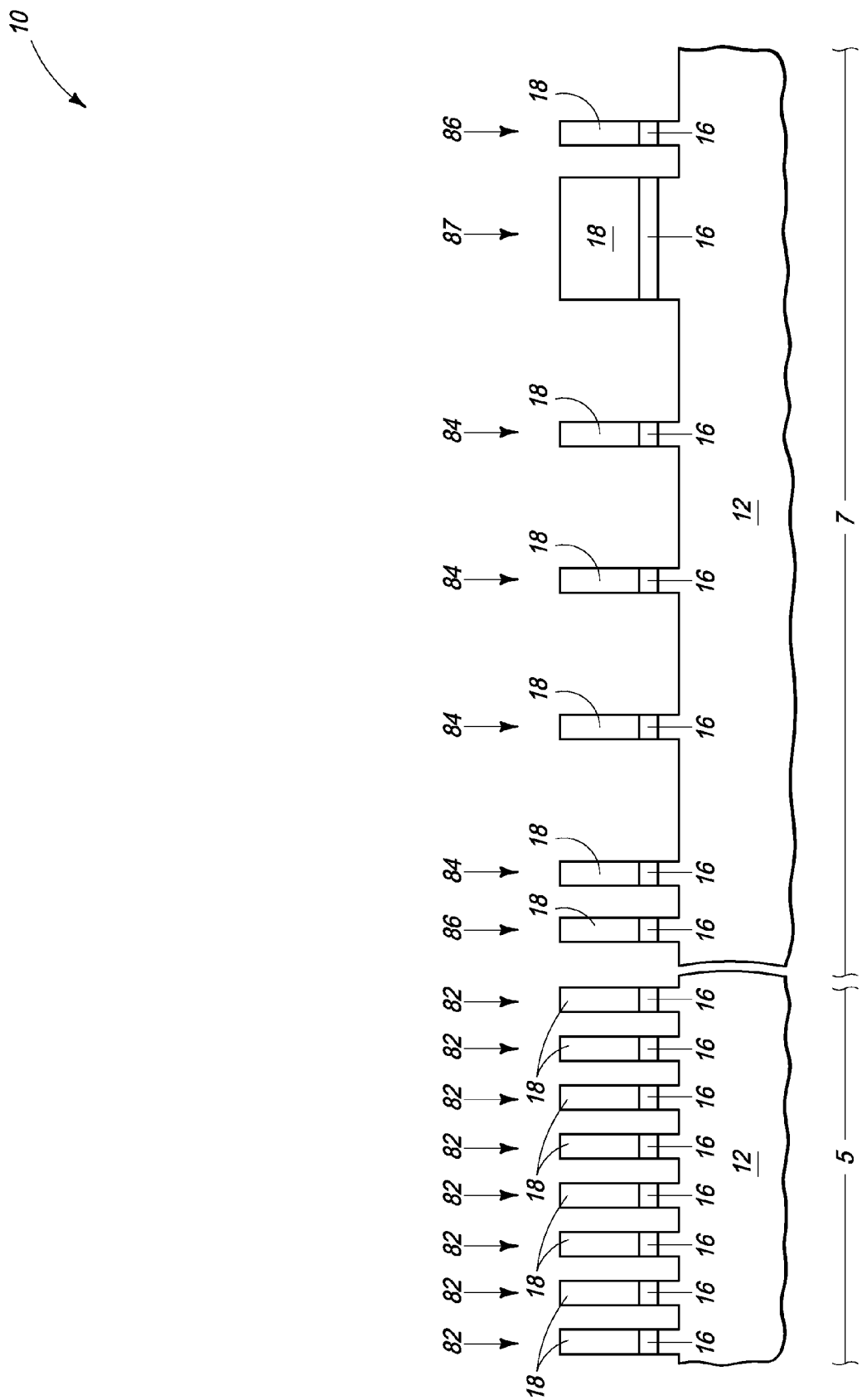

Referring to FIG. 13, the masking features 82, 84, 86 and 87 are utilized to pattern the silicon nitride material 16 and the base 12. In the shown embodiment, the masking features 82, 84, 86 and 87 remain over patterned material 16 and patterned base 12. In other embodiments, the masking features may be utilized to pattern the silicon nitride material into a hard mask, and then may be removed while such hard mask is utilized to pattern the underlying base 12.

The embodiment of FIG. 13 shows base 12 as a homogeneous structure. However, as discussed above with reference to FIG. 1, the base may comprise numerous materials associated with integrated circuit fabrication; including, for example, various conductive materials, semiconductor materials and insulative materials. The pattern formed into the base may extend into one or more materials of the base to pattern such materials. For instance, at least some of the pattern formed across region 5 may be utilized to pattern one or more materials for fabrication of memory array circuitry (such as, for example, DRAM circuitry, NAND circuitry, etc.), and at least some of the pattern formed across region 7 by masking features 84 and 87 may be utilized to pattern one or more materials for fabrication of control circuitry and/or routing circuitry. The masking features 86 may also pattern materials for fabrication of control circuitry and/or routing circuitry; or, in some embodiments, features 86 may be residual features resulting from the processing described herein which create a vestigial (i.e., functionless) pattern in a semiconductor structure.

Figure 14:
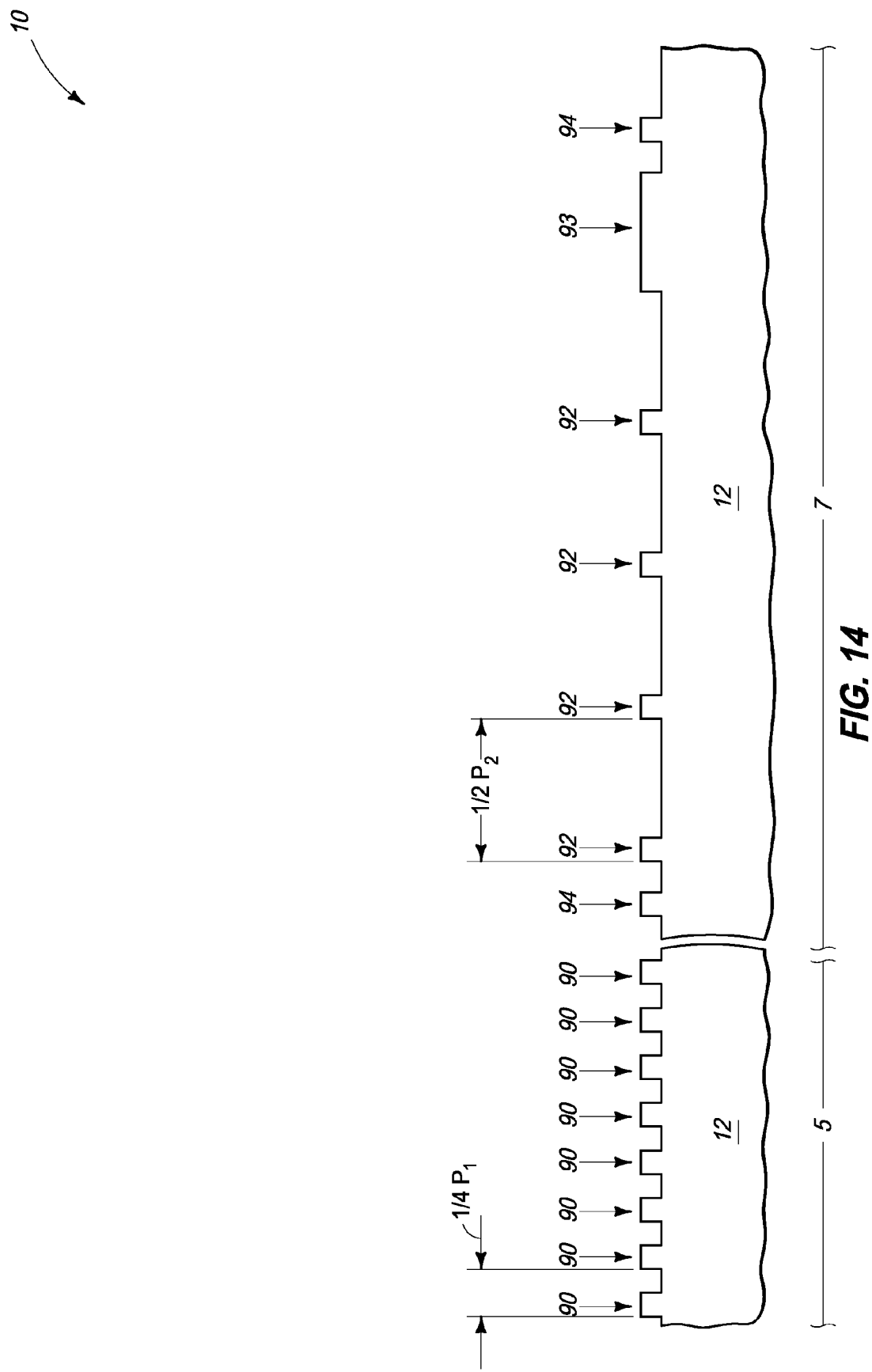

Referring to FIG. 14, materials 16 and 18 (FIG. 13) are removed to leave the patterned base 12. The patterned base has features 90 over region 5 formed to a pitch of ¼ $P_1$, and has features 92 over region 7 formed to a pitch of ½ $P_2$. Thus, the methodology of FIGS. 1-14 may be utilized to fabricate components having a relatively tight pitch across one region of a base, while also fabricating components having a relatively loose pitch across another region of the base. The patterned base also has features 93 patterned from the additional photoresist features 51 provided at the processing stage of FIG. 6. In some embodiments, features 90, 92 and 93 may comprise identical patterned materials of base 12; and in other embodiments at least one of the features may comprise different materials than at least one other of the features.

Figure 15:
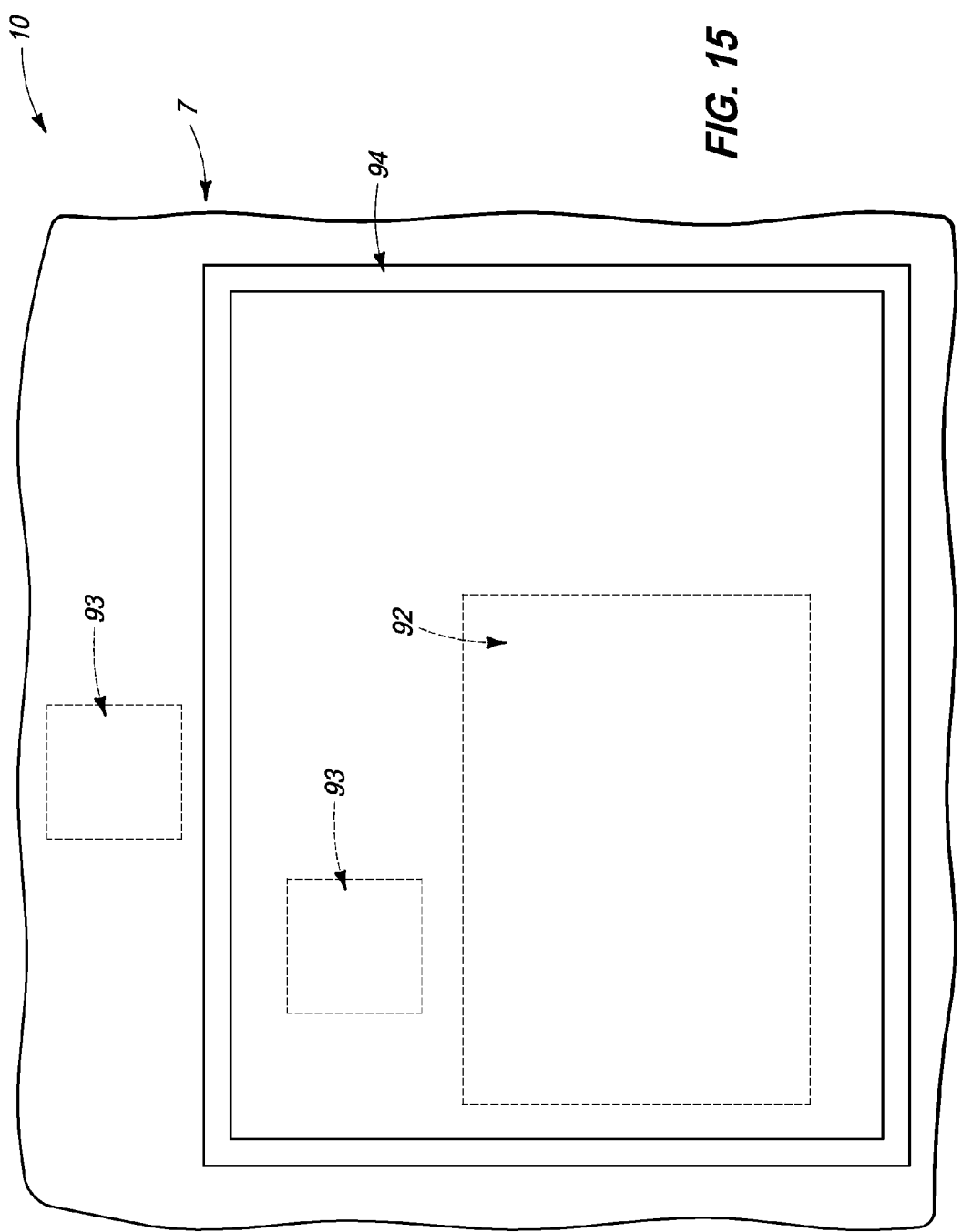
FIG. 15 is a diagrammatic plan view of a region of the semiconductor construction of FIG. 14.

The patterned base 12 has features 94 generated from the masking features 86 (FIG. 13), and corresponding to locations where the spacers 76 (FIG. 10) are formed alongside the lateral edges of the protective mask 68 (FIG. 10). The features 94 may be a pair of separate features (as shown) or may be part of a continuous fence around an area of base 12. For instance, FIG. 15 shows a plan view of region 7 in an embodiment in which the features 94 are configured as a fence extending entirely around a portion of peripheral region 7. The portion surrounded by such fence may be referred to as a fenced-in area. The features 92 are generically shown in FIG. 15 as a region (designated with a dashed-line) comprising features 92 in order to simplify the drawing. Such features 92 may have any suitable configuration, and in some embodiments may correspond to routing structures that extend across the fenced-in area. Such routing structures may be electrically conductive interconnects utilized to couple memory cells formed in the memory region 5 with logic circuitry, or other circuitry, formed in the peripheral region 7 outside of the fenced-in area. The routing structures may extend across the fenced-in area, and under the fence 94 to electrically couple with other circuitry outside of the fenced-in area. The wide features 93 may also be part of the circuitry formed in peripheral region 7. In the shown embodiment, features 93 are generically shown in regions comprising the features 93 (designated with dashed-lines). The processing of FIGS. 6-13 forms features 93 within the fenced-in area of features 94. Other processing may be utilized in addition to, or alternatively to, such processing to form features 93 outside of the fenced-in area, and accordingly a region of features 93 is also shown outside of the fenced-in area in FIG. 15. Example processing which may be utilized for forming features 93 outside of the fenced-in area 94 is discussed below with reference to FIGS. 16-21.

The feature 93 is wider than the other features along the cross-section of FIG. 14 due to the feature 93 having been etched under a lithographic pattern (51 of FIG. 6), while the features 90, 92 and 94 were etched under sub-lithographic patterns (46 and 48 of FIG. 6, and 76 of FIG. 11). In some embodiments, features 90, 92 and 94 may comprise about a same cross-sectional width as one another along the cross-section of FIG. 14 (i.e., may comprise about the same lateral dimensions as one another along such cross-section), while feature 93 has a cross-sectional width at least about double the individual widths of features 90, 92 and 94 (or at least about triple, at least about four-times, etc., in various example embodiments). In some embodiments, features 92 may be referred to as first patterned features formed within the fenced-in area defined by the fence 94, with such features having about the same lateral dimension as the fence along a cross-section (for instance, the cross-section of FIG. 14). In such embodiments, feature 93 may be referred to as a second patterned feature inside of the fenced-in area and having a lateral dimension along the cross-section which is at least about double the lateral dimension of the fence (or at least about triple, at least about four-times, etc., in various example embodiments). The feature 93 may be representative of a plurality of features. In some embodiments, all of the features 93 may be inside of the fenced-in area defined by the fence 94, and in other embodiments only some of the features 93 may be inside of such fenced-area.

The fence 94 of FIGS. 14 and 15 may comprise any suitable materials of base 12, and in some embodiments may comprise electrically insulative material; such as, for example, silicon dioxide or silicon nitride. In some embodiments, the patterned features 92 comprise one or more patterned materials of base 12, and the fence 94 comprises identical patterned materials as the patterned features. In other words, the materials of the patterned features 92 extend to the locations where the fence 94 is formed and are incorporated into such fence. In other embodiments, the patterned features 92 comprise one or more patterned materials of base 12 that are not comprised by the fence 94 and/or the fence comprises one or more materials that are not comprised by the patterned features. In other words, one or more materials of the patterned features 92 do not extend to the locations where the fence 94 is formed and/or one or more materials incorporated into the fence 94 do not extend across locations where the patterned features 92 are formed. Similarly, features 93 may or may not comprise identical patterned materials as one or both of features 92 and fence 94.

In the shown embodiment of FIGS. 14 and 15, the fence 94 is associated with region 7 of the base, but it is to be understood that the fence 94 may be associated with other regions of the base depending on the configuration of the protective mask 68 (FIG. 10). The fence 94 may correspond to a patterned component of an integrated circuit in some embodiments, or may correspond to a vestigial structure that results from tag-along patterning associated with the spacers 76 (FIG. 11) through the process stages of FIGS. 12-14 in other embodiments.

FIGS. 13 and 14 illustrate an embodiment in which masking feature patterns are transferred into one or more materials of an underlying base by utilizing the masking features to pattern an etch. In other embodiments, masking feature patterns may be transferred into one or more materials of an underlying base by utilizing the masking features to pattern a dopant implant into the underlying base.

As discussed above, the processing of FIGS. 6-15 forms features 93 within a fenced-in area defined by the fence 94 of FIGS. 14 and 15. Other processing may be utilized to form at least some features 93 outside of the fenced-in area. FIGS. 16-21 describe an example embodiment method for forming at least some of the features 93 outside of such fenced-in area.

Figure 16:
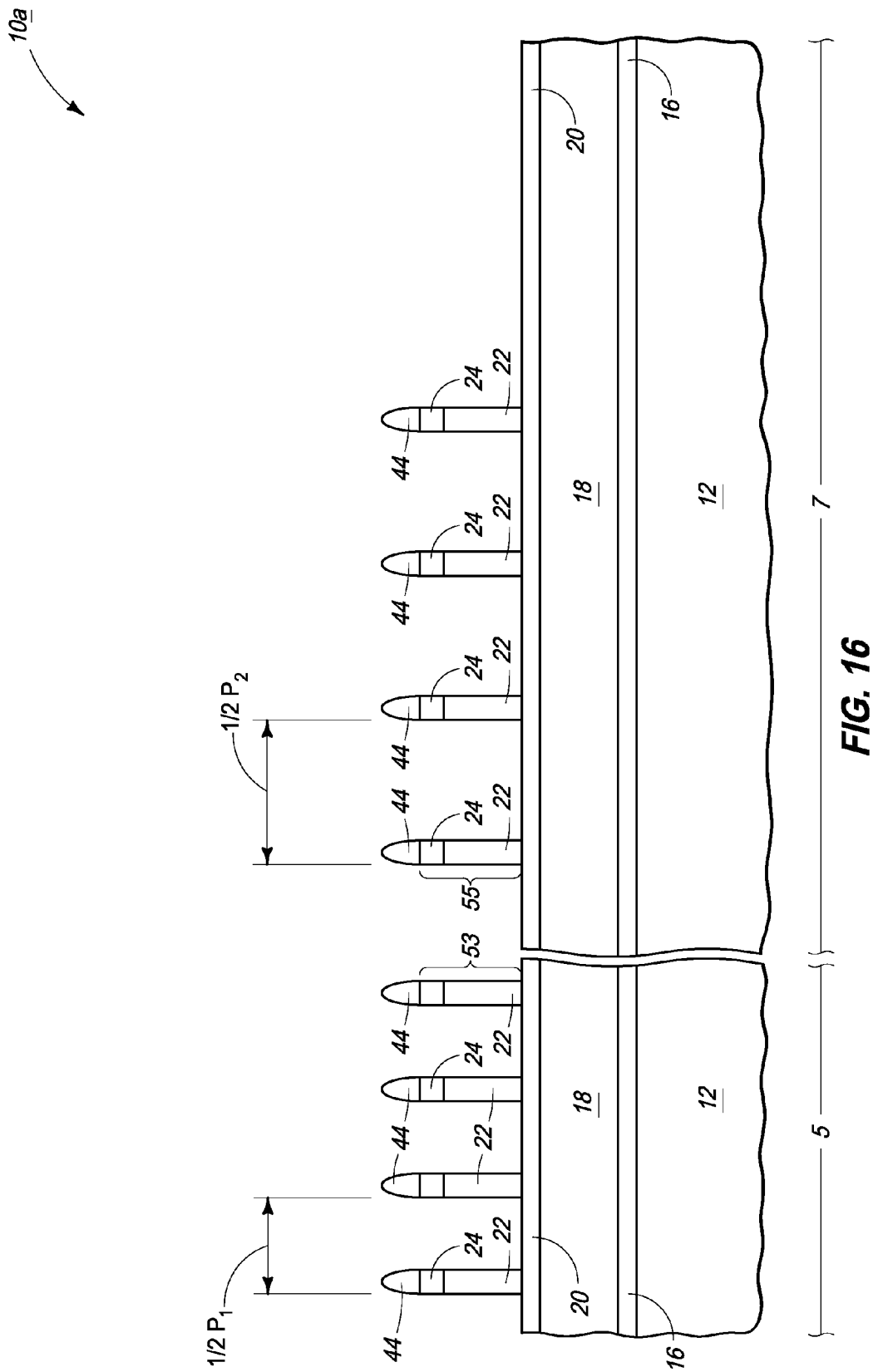

Referring to FIG. 16, a construction 10a is shown at a processing stage subsequent to that of FIG. 5. The first pedestals 53 and second pedestals 55 have been formed over regions 5 and 7, respectively, utilizing processing analogous to that described above with reference to FIG. 7. In the shown embodiment, some of the spacer material 44 remains over pedestals 53 and 55. In other embodiments, an entirety of such spacer material may be removed during formation of the pedestals 53 and 57.

Figure 17:
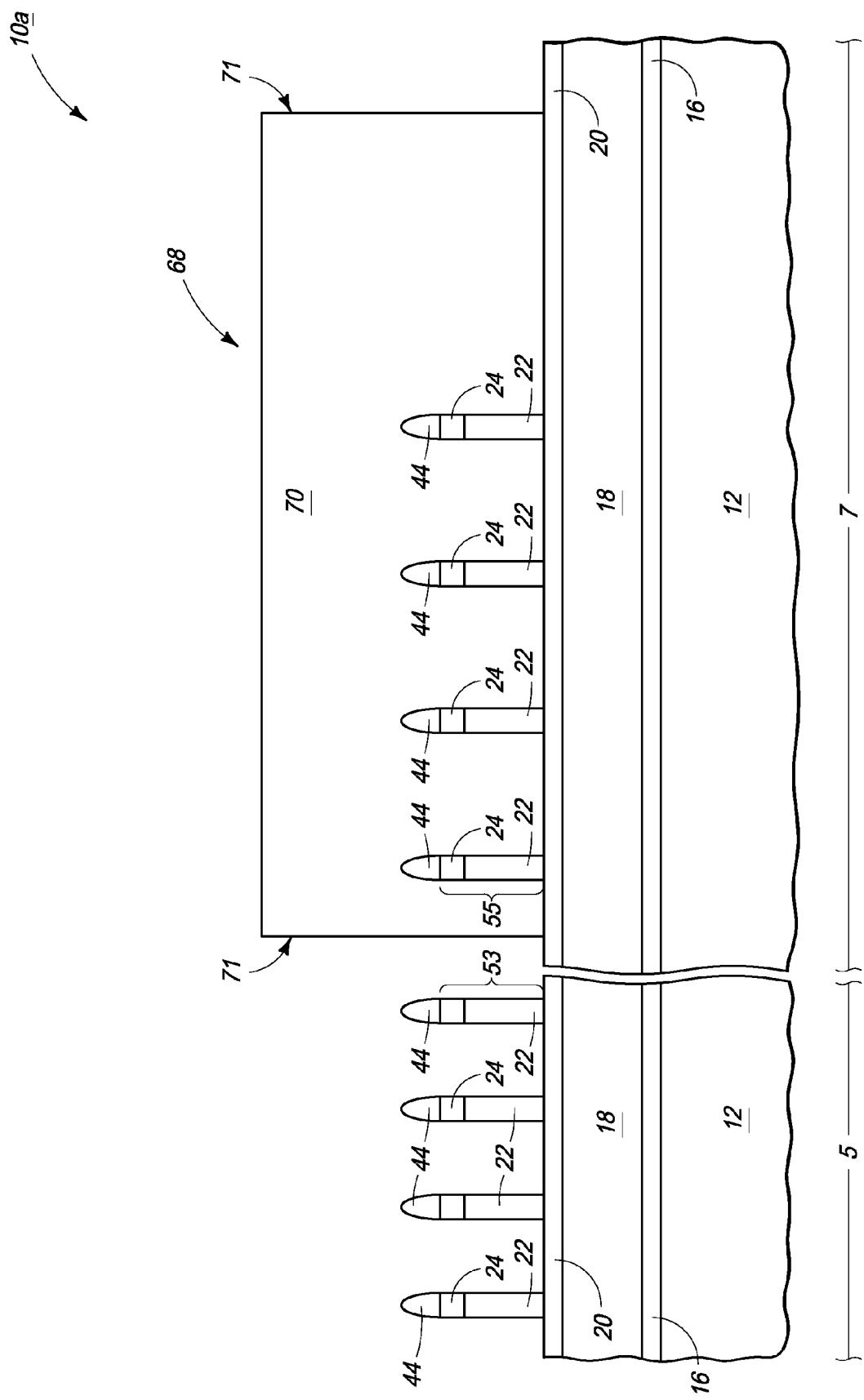

Referring to FIG. 17, the mask 68 is formed over pedestals 55. Such mask may be formed utilizing processing analogous to that described above with reference to FIG. 8.

Figure 18:
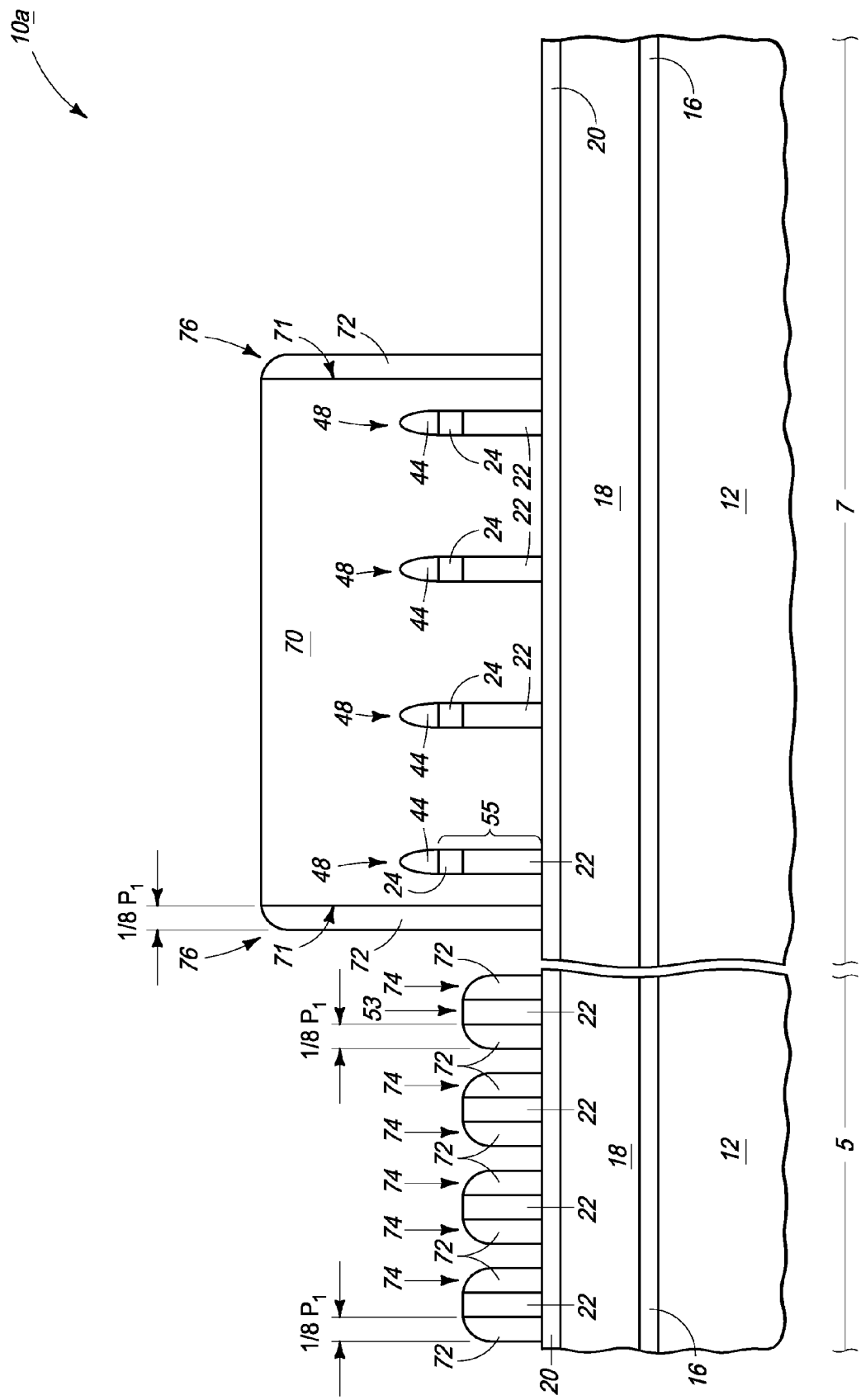

Referring to FIG. 18, residual spacer material 44 and silicon oxynitride 24 (FIG. 17) are removed from over exposed pedestals 53; and anisotropically-etched spacers 74 and 76 are formed along sidewalls of pedestals 53 and along the lateral edges 71 of mask 68, respectively. In some embodiments, spacers 74 may be referred to as third spacers and spacers 76 may be referred to as fourth spacers. The processing of FIG. 18 may be conducted analogously to the above-discussed processing of FIGS. 9 and 10. In some embodiments, the residual spacer material 44 and silicon oxynitride 24 (FIG. 17) may be removed before formation of anisotropically-etched spacers 74 and 76, and in other embodiments such residual spacer material and silicon oxynitride may be removed after formation of the anisotropically-etched spacers 74 and 76.

The spacers 74 and 76 have widths of about ⅛ $P_1$ (which is equivalent to 1/12 $P_2$ in the embodiment presented herein, as described in FIG. 2).

Figure 19:
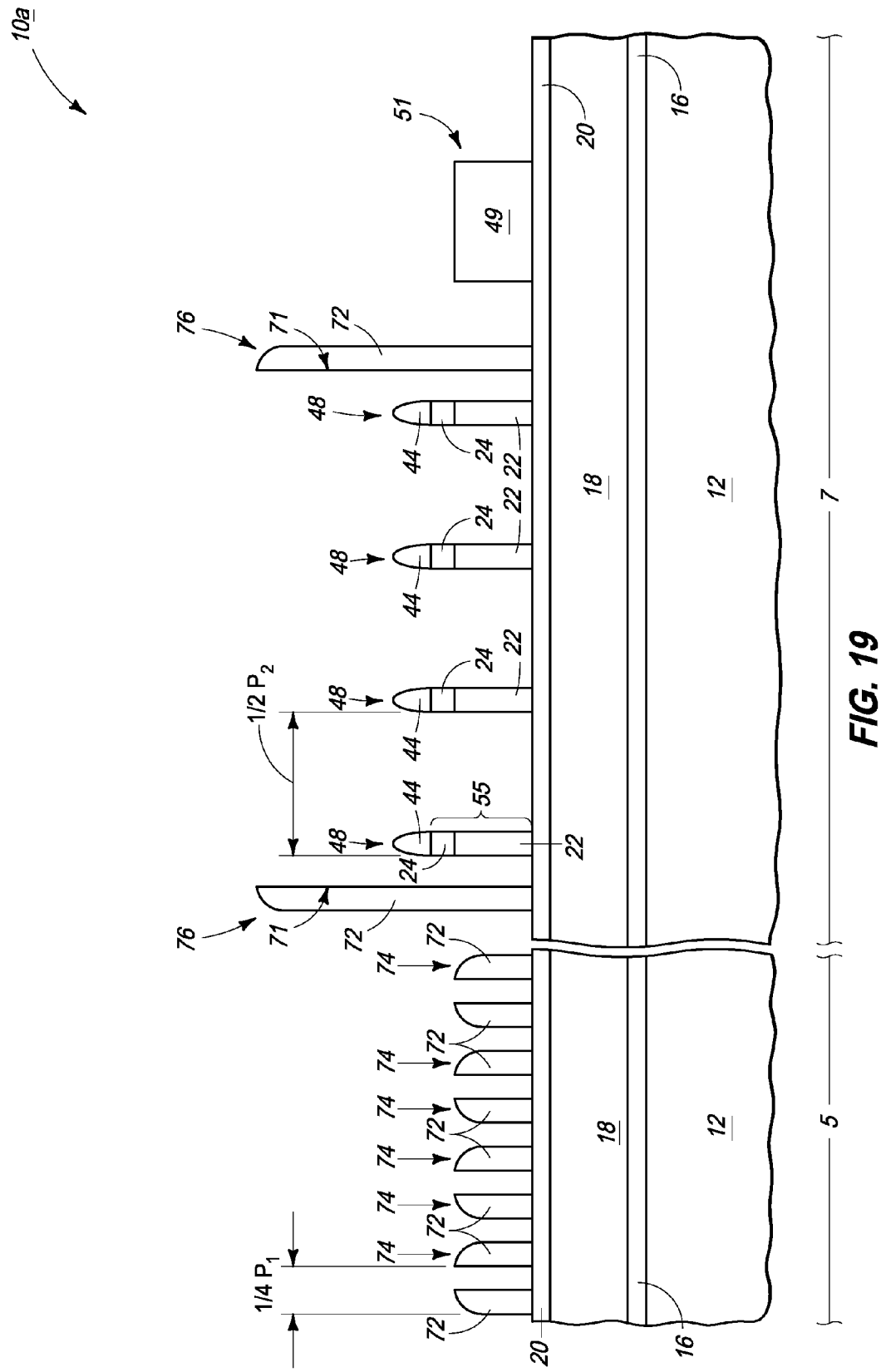

Referring to FIG. 19, the photoresist mask 68 (FIG. 18) is removed together with the carbon-containing material 22 of pedestals 53 (FIG. 18) utilizing an anisotropic oxidative etch analogous to the etch described above with reference to FIG. 11.

The spacers 74 remaining at the processing stage of FIG. 19 are on a pitch of about ¼ $P_1$ in the shown embodiment, and the pedestals 55 are on a pitch of about ½ $P_2$.

A patterned masking feature 51 is formed over region 7 of base 12 utilizing processing analogous to that described above with reference to FIG. 6. The masking feature comprises a material 49 which may be photoresist in some embodiments. Although one additional masking feature 51 is shown, such feature may be representative of a large number of additional features which are formed at the processing stage of FIG. 19.

In some embodiments, the spacers 76 of FIG. 19 may be comprised by a wall that extends around a portion of the second region 7 of base 12, with such portion including a region between the illustrated spacers 76. In the shown embodiment, patterned masking feature 51 is formed outside of such walled-in portion. In other embodiments, the patterned masking feature 51 may be formed within such walled-in portion (utilizing, for example, the processing of FIGS. 6-14) alternatively to, or additionally to, being formed outside of such wall-in portion.

The feature 51 is a lithographic-sized feature, whereas spacers 74, spacers 76, and pedestals 55 of FIG. 19 are sub-lithographic features. Accordingly, feature 51 is shown to have a much larger width along the cross-section of FIG. 19 than the spacers 74, spacers 76 and pedestals 55. In some embodiments, the width of feature 51 may be at least about twice as large as the widths of spacers 74, spacers 76 and pedestals 55 along the cross-section of FIG. 19 (or at least about three-times as large, at least about four-times as large, etc.).

Figure 20:
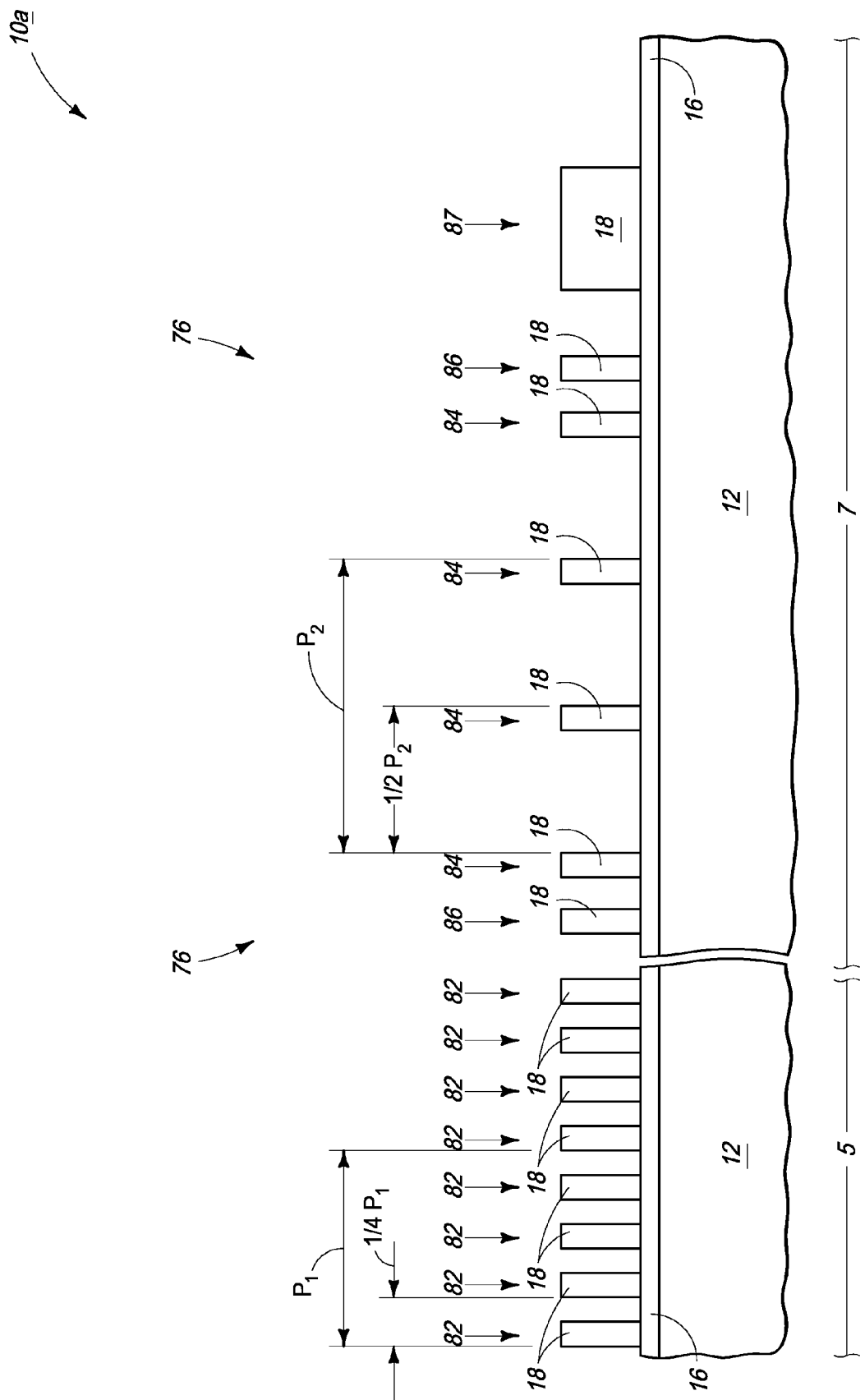

Referring to FIG. 20, the pattern of spacers 74 (FIG. 19) is transferred into the underlying material 18 to form a plurality of masking features 82 over region 5 of the base; and the pattern of pedestals 55 (FIG. 19) is transferred into the underlying material 18 to form a plurality of masking features 84 over region 7 of the base. Also, the pattern of spacers 76 (FIG. 19) is transferred into the underlying material 18 to form masking features 86, and the pattern of feature 51 (FIG. 19) is transferred into underlying material 18 to form a masking feature 87. Although there appear to be two masking features 86 in the side view of FIG. 20, the illustrated masking features 86 may be part of single continuous masking feature that forms a fence around a portion of region 7, analogous to the description provided above with reference to FIG. 12. The embodiment of FIG. 20 differs from that of FIG. 12 in that feature 87 is outward of the fenced-in area between features 86, rather than being within such fenced-in area.

The features 82, 84, 86 and 87 may be formed with any suitable processing; such as, for example, processing analogous to that described above with reference to FIG. 12.

The masking features 82 have a pitch which is about ¼ $P_1$, and the masking features 84 have a pitch which is about ½ $P_2$.

Referring to FIG. 21, the masking features 82, 84, 86 and 87 are utilized to form structures 90, 92, 94 and 93, respectively in base 12 utilizing processing analogous to that described above with reference to FIGS. 13 and 14.

The embodiment of FIG. 21 shows base 12 as a homogeneous structure. However, as discussed above with reference to FIG. 1, the base may comprise numerous materials associated with integrated circuit fabrication; including, for example, various conductive materials, semiconductor materials and insulative materials. The pattern formed into the base may extend into one or more materials of the base to pattern such materials. For instance, at least some of the pattern formed across region 5 may be utilized to pattern one or more materials for fabrication of memory array circuitry (such as, for example, DRAM circuitry, NAND circuitry, etc.), and at least some of the pattern formed across region 7 by may be utilized to pattern one or more materials for fabrication of control circuitry and/or routing circuitry.

In some embodiments, features 90, 92, 93 and 94 may comprise identical patterned materials of base 12; and in other embodiments at least one of the features may comprise different materials than at least one other of the features.

The features 94 of FIG. 21 may be part of a continuous fence around an area of base 12, analogous to the shown fenced-in area of FIG. 15. The embodiment of FIG. 21 has the wide features 93 outside of such fenced-in area.

In some embodiments, features 92 may be referred to as first patterned features formed within the fenced-in area defined by the fence 94, with such features having about the same lateral dimension as the fence along a cross-section (for instance, the cross-section of FIG. 21). In such embodiments, feature 93 may be referred to as a second patterned feature outside of the fenced-in area and having a lateral dimension along the cross-section which is at least about double the lateral dimension of the fence (or at least about triple, at least about four-times, etc., in various embodiments). The feature 93 may be representative of a plurality of features. In some embodiments, all of the features 93 may be outside of the fenced-in area defined by the fence 94, and in other embodiments only some of the features 93 may be outside of such fenced-area.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

For purposes of interpreting this disclosure and the claims that follow, a first material is considered to be "selectively removed" relative to a second material if the first material is removed at a faster rate than the second material; which can include, but is not limited to, embodiments in which the first material is removed under conditions which are 100 percent selective for the first material relative to the second material.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include methods of patterning a base. First masking features are formed over a first region of the base, and second masking features are formed over a second region of the base. The first and second masking features comprise pedestals of carbon-containing material capped with silicon oxynitride. A protective mask is formed over the second masking features while leaving the first masking features exposed. The silicon oxynitride caps are removed from the first masking features while the protective mask remains over the second masking features. Spacers are formed along sidewalls of the first masking features. The protective mask and the carbon-containing material of the first masking features are removed while leaving the second masking features remaining over the second region and while leaving the spacers remaining over the first region. Patterns of the spacers and second masking features are transferred into one or more materials of the base to pattern said one or more materials.

Some embodiments include methods of patterning multiple regions of a base. A stack is formed over the base. The stack comprises, in ascending order from the base, a first silicon oxynitride material, carbon-containing material and a second silicon oxynitride material. The first silicon oxynitride material has a greater silicon content than the second silicon oxynitride material. Photoresist features are formed over the stack. Anisotropically-etched spacers are formed along sidewalls of the photoresist features. The photoresist features are removed while leaving the anisotropically-etched spacers over the stack. The anisotropically-etched spacers over a first region of the base being first spacers, and the anisotropically-etched spacers over a second region of the base being second spacers. The second silicon oxynitride material and the carbon-containing material are etched while using the first and second spacers as a first mask. The etching forms first pedestals over the first region, and forms second pedestals over the second region. A second mask is formed over the second pedestals and not over the first pedestals. While the second mask is over the second pedestals, the second silicon oxynitride material is removed from the first pedestals and additional spacers are formed along sidewalls of the first pedestals. The second mask and the carbon-containing material of the first pedestals are removed while leaving the second pedestals and additional spacers remaining over the base. Patterns of the additional spacers and the second pedestals are transferred into one or more materials of the base to pattern said one or more materials.

Some embodiments include methods of patterning multiple regions of a base. A stack is formed over the base. The stack comprises, in ascending order from the base, a first silicon oxynitride material, carbon-containing material, and a second silicon oxynitride material. The first silicon oxynitride material has a greater silicon content than the second silicon oxynitride material. First photoresist features are formed over the stack. Anisotropically-etched spacers are formed along sidewalls of the first photoresist features. The first photoresist features are removed while leaving the anisotropically-etched spacers over the stack. The anisotropically-etched spacers over a first region of the base are first spacers, and the anisotropically-etched spacers over a second region of the base are second spacers. After removing the first photoresist features, one or more additional photoresist features are formed over the stack. The second silicon oxynitride material and the carbon-containing material are etched while using the first and second spacers and the one or more additional photoresist features as a first mask. The etching forms first pedestals over the first region, forms second pedestals over the second region, and forms one or more third pedestals from the second silicon oxynitride material and carbon-containing material under the one or more additional photoresist features. A second mask is formed over the second and third pedestals, and not over the first pedestals. While the second mask is in place, the second silicon oxynitride material is removed from the first pedestals, and additional spacers are formed along sidewalls of the first pedestals. The second mask and the carbon-containing material of the first pedestals are removed while leaving the second and third pedestals remaining over the base and while leaving the additional spacers remaining over the first region. Patterns of the additional spacers, and the second and third pedestals are transferred into one or more materials of the base to pattern said one or more materials.

Some embodiments include methods of patterning multiple regions of a base. A stack is formed over the base. The stack comprises, in ascending order from the base, a first silicon oxynitride material, carbon-containing material, and a second silicon oxynitride material. The first silicon oxynitride material has a greater silicon content than the second silicon oxynitride material. First photoresist features are formed over the stack. Anisotropically-etched spacers are formed along sidewalls of the first photoresist features. The first photoresist features are removed while leaving the anisotropically-etched spacers over the stack. The anisotropically-etched spacers over a first region of the base are first spacers, and the anisotropically-etched spacers over a second region of the base are second spacers. The second silicon oxynitride material and the carbon-containing material are etched while using the first and second spacers as a first mask. The etching forms first pedestals over the first region, and forms second pedestals over the second region. A second mask is formed over the second pedestals and not over the first pedestals. The second mask has lateral edges. While the second mask is over the second pedestals, the second silicon oxynitride material is removed from the first pedestals. Third spacers are formed along sidewalls of the first pedestals, and fourth spacers are formed along the lateral edges of the second mask. The second mask and the carbon-containing material of the first pedestals are removed while leaving the third spacers, fourth spacers, and second pedestals remaining over the base. After the second mask is removed, one or more additional photoresist features are formed over the stack. Patterns of the additional photoresist features, the second pedestals, and the third and fourth spacers are transferred into one or more materials of the base to pattern said one or more materials.

Some embodiments include a patterned base having a fence around an area of the base. The area of the base surrounded by the fence is a fenced-in area. The fence has a lateral dimension along a cross-section. A plurality of first patterned features are within the fenced-in area and have lateral dimensions along the cross-section that are about the same as the lateral dimension of the fence. One or more second patterned features are outside and/or inside of the fenced-in area and have lateral dimensions along the cross-section at least about double the lateral dimension of the fence.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of patterning a base, comprising:
   forming first masking features over a first region of the base, and forming second masking features over a second region of the base; the first and second masking features comprising carbon-containing material and silicon oxynitride; the base being a semiconductor base;
   forming a covering over the second masking features while leaving the first masking features exposed;
   removing silicon oxynitride from the first masking features while the second masking features are covered by said covering;
   forming spacers along sidewalls of the first masking features;
   removing the covering and the carbon-containing material of the first masking features while leaving the second masking features remaining over the second region and while leaving the spacers remaining over the first region; and
   transferring patterns of the spacers and second masking features into one or more materials of the base to pattern said one or more materials.

2. The method of claim 1 wherein:
   the covering has lateral edges;
   the spacers are first spacers, and second spacers are formed along the lateral edges of the covering while the first spacers are formed;
   the second spacers remain over the base after the covering is removed; and
   the patterns of the second spacers are transferred into the base together with the patterns of the first spacers and second masking features.

3. The method of claim 2 wherein the first and second spacers are formed after removing the silicon oxynitride from the first masking features.

4. The method of claim 2 wherein the covering comprises carbon, and wherein the first and second spacers comprise silicon dioxide.

5. The method of claim 2 wherein the covering comprises photolithographically-patterned photoresist.

6. A method of patterning multiple regions of a base, comprising:
   forming a stack over the base; the stack comprising, in ascending order from the base, a first silicon oxynitride material, carbon-containing material, and a second silicon oxynitride material; the first silicon oxynitride material having a greater silicon content than the second silicon oxynitride material; the base comprising monocrystalline silicon and being a semiconductor base;
   forming first photoresist features over the stack;
   forming anisotropically-etched spacers along sidewalls of the first photoresist features;
   removing the first photoresist features while leaving the anisotropically-etched spacers over the stack; the anisotropically-etched spacers over a first region of the base being first spacers, and the anisotropically-etched spacers over a second region of the base being second spacers;
   etching through the second silicon oxynitride material and the carbon-containing material while using the first and second spacers as a first mask; the etching forming first pedestals over the first region from the second silicon oxynitride and carbon-containing material under the first spacers, and forming second pedestals over the second region from the second silicon oxynitride material and carbon-containing material under the second spacers;
   forming a second mask over the second pedestals, and not over the first pedestals; the second mask having lateral edges;
   while the second mask is over the second pedestals, removing the second silicon oxynitride material from the first pedestals;

forming third spacers along sidewalls of the first pedestals and forming fourth spacers along the lateral edges of the second mask;

removing the second mask and the carbon-containing material of the first pedestals while leaving the third spacers, fourth spacers, and second pedestals remaining over the base;

after removing the second mask, forming one or more additional photoresist features over the stack; and transferring patterns of the additional photoresist features, the second pedestals, and the third and fourth spacers into one or more materials of the base to pattern said one or more materials.

7. The method of claim 6 wherein the fourth spacers form a wall around a portion of the second region of the base, and wherein one or more of the additional photoresist features are formed outside of such wall.

8. The method of claim 6 wherein the fourth spacers form a wall around a portion the second region of the base, and wherein one or more of the additional photoresist features are formed inside of such wall.

9. The method of claim 6 wherein the photoresist features formed over the first region are at a tighter pitch than the photoresist features formed over the second region.

10. A patterned base, comprising:

an enclosing structure over the base and surrounding an area of the base, the area of the base surrounded by the enclosing structure being an inner area, the enclosing structure comprising rails having a lateral dimension along a cross-section;

the base comprising semiconductor material;

a plurality of first patterned features within the inner area and having lateral dimensions along the cross-section that are about the same as the lateral dimension of the rails; and one or more second patterned features within the inner area and/or outside of the inner area and having lateral dimensions along the cross-section at least about double the lateral dimension of the rails.

11. The patterned base of claim 10 wherein at least some of the second patterned features are outside of the inner area.

12. The patterned base of claim 10 wherein all of the second patterned features are outside of the inner area.

13. The patterned base of claim 10 wherein at least some of the second patterned features are within the inner area.

14. The patterned base of claim 10 wherein all of the second patterned features are within the inner area.

15. The patterned base of claim 10 wherein the first and second patterned features comprise one or more patterned materials, and wherein the enclosing structure comprises identical patterned materials as the first and second patterned features.

* * * * *